(12) United States Patent
Heim et al.

(10) Patent No.: US 12,261,413 B2
(45) Date of Patent: Mar. 25, 2025

(54) TUNABLE LASER ASSEMBLY AND METHOD OF CONTROL

(71) Applicant: Thorlabs Quantum Electronics, Inc., Jessup, MD (US)

(72) Inventors: Peter J. S. Heim, Washington, DC (US); John Hryniewicz, Columbia, MD (US); Jacob Mertz, Elkridge, MD (US); Jianfei Wang, Potomac, MD (US)

(73) Assignee: Thorlabs Quantum Electronics, Inc., Jessup, MD (US)

( * ) Notice: Subject to any disclaimer, the term of this patent is extended or adjusted under 35 U.S.C. 154(b) by 966 days.

(21) Appl. No.: 17/195,794

(22) Filed: Mar. 9, 2021

(65) Prior Publication Data

US 2021/0281048 A1 Sep. 9, 2021

Related U.S. Application Data

(60) Provisional application No. 62/989,007, filed on Mar. 13, 2020, provisional application No. 62/987,102, filed on Mar. 9, 2020.

(51) Int. Cl.
*H01S 3/13* (2006.01)
*G01B 9/02004* (2022.01)
(Continued)

(52) U.S. Cl.
CPC ........ *H01S 5/0683* (2013.01); *G01B 9/02004* (2013.01); *G01B 9/02091* (2013.01);
(Continued)

(58) Field of Classification Search
CPC ..... H01S 3/1305; H01S 5/0683; H01S 5/0687
See application file for complete search history.

(56) References Cited

U.S. PATENT DOCUMENTS 5,850,292 A 12/1998 Braun
5,982,791 A 11/1999 Sorin et al.
(Continued)

FOREIGN PATENT DOCUMENTS

CN 1862898 A 11/2006
CN 207439428 U 6/2018
(Continued)

OTHER PUBLICATIONS

Nasu, H. et al., "Wavelength Monitor Integrated Laser Modules for 25-GHz-Spacing Tunable Applications", IEEE Journal of Selected Topics in Quantum Electronics, Jan./Feb. 2005, pp. 157-164, vol. 11, No. 1, IEEE.
(Continued)

*Primary Examiner* — Michael Carter
(74) *Attorney, Agent, or Firm* — Myers Wolin, LLC

(57) ABSTRACT

A tunable laser assembly housed in a single enclosure and a method of control is described wherein the tunable laser, pump and semiconductor optical amplifier do not share a common optical axis but are all aligned to optical waveguides on an intervening planar lightwave circuit (PLC). Wavelength monitoring circuitry is included on the PLC to enable monitoring and control of the tunable laser center wavelength and optical bandwidth. The design of the PLC
(Continued)

does not introduce perturbations into the swept-source laser output spectrum that would cause artifacts in imaging applications such as optical coherence tomography (OCT).

18 Claims, 27 Drawing Sheets

(51) Int. Cl.
| | |
|---|---|
| *G01B 9/02091* | (2022.01) |
| *H01S 5/00* | (2006.01) |
| *H01S 5/02251* | (2021.01) |
| *H01S 5/02253* | (2021.01) |
| *H01S 5/024* | (2006.01) |
| *H01S 5/026* | (2006.01) |
| *H01S 5/0683* | (2006.01) |
| *H01S 5/14* | (2006.01) |
| *H01S 5/183* | (2006.01) |

(52) U.S. Cl.
CPC .......... *H01S 3/1305* (2013.01); *H01S 5/0064* (2013.01); *H01S 5/02251* (2021.01); *H01S 5/02253* (2021.01); *H01S 5/02415* (2013.01); *H01S 5/026* (2013.01); *H01S 5/06835* (2013.01); *H01S 5/142* (2013.01); *H01S 5/18361* (2013.01)

(56) References Cited

U.S. PATENT DOCUMENTS

| | | | |
|---|---|---|---|
| 6,043,883 A | 3/2000 | Leckel et al. | |
| 6,362,878 B1 | 3/2002 | Wang et al. | |
| 6,486,984 B1 | 11/2002 | Baney et al. | |
| 6,498,800 B1 | 12/2002 | Watterson et al. | |
| 6,594,022 B1 | 7/2003 | Watterson et al. | |
| 8,923,349 B2 * | 12/2014 | Huber ............... | H01S 3/137 |
| | | | 372/18 |
| 9,766,131 B2 | 9/2017 | Seeley et al. | |
| 10,215,551 B2 * | 2/2019 | Potsaid .............. | G01B 9/02067 |
| 2004/0264981 A1 | 12/2004 | Zhang et al. | |
| 2008/0037608 A1 | 2/2008 | Zhou et al. | |
| 2011/0178413 A1 | 7/2011 | Schmitt et al. | |
| 2014/0125991 A1 * | 5/2014 | Johnson ............. | G01B 9/02069 |
| | | | 356/497 |
| 2017/0074640 A1 * | 3/2017 | Cable ................. | G01B 9/02004 |
| 2018/0249555 A1 | 8/2018 | Sugiyama | |
| 2019/0137687 A1 | 5/2019 | Daniel | |
| 2020/0069225 A1 | 3/2020 | Vizbaras et al. | |
| 2021/0281046 A1 | 9/2021 | Heim et al. | |

FOREIGN PATENT DOCUMENTS

| | | |
|---|---|---|
| CN | 108474643 A | 8/2018 |
| CN | 108474992 A | 8/2018 |
| EP | 3879643 A1 | 9/2021 |
| EP | 3879644 A1 | 9/2021 |
| WO | 2009105633 A2 | 8/2009 |

OTHER PUBLICATIONS

Yu, Runxiang et al., "Rapid High-Precision In Situ Wavelength Calibration for Tunable Lasers Using an Athermal AWG and a PD Array", IEEE Photonics Technology Letters, Jan. 1, 2012, pp. 70-72, vol. 24, No. 1, IEEE.

Keysight Technologies, "81980A, 81960A, 81940A, 81989A, 81949A, and 81950A Compact Tunable Laser Sources Data Sheet", 5988-8518EN, Dec. 2017, pp. 1-13.

Kim, Ryun et al., "Highly Linear-Polarized External Cavity Lasers Hybrid Integrated on Planar Lightwave Circuit Platform", IEEE Photonics Technology Letters, Feb. 15, 2006, pp. 580-582, vol. 18, No. 4, IEEE.

Fan, Youwen et al., "Optically Integrated InP—Si3N4 Hybrid Laser," IEEE Photonics Journal, Dec. 1, 2016, pp. 1-12, vol. 8, No. 6, Article Sequence No. 1505111.

Komljenovic, T., "Heterogeneous Silicon Photonic Integrated Circuits", J. Lightwave Technol., vol. 34, No. 1, 2016, pp. 20-35.

Huang, Duanni et al., "Sub-kHz linewidth Extended-DBR Lasers heterogeneously integrated on silicon", 2019 Optical Fiber Communications Conference and Exhibition (OFC), pp. 1-3, IEEE.

Schwelb, Otto, "Transmission, Group Delay, and Dispersion in Single-Ring Optical Resonators and Add/Drop filters—A Tutorial Overview", Journal of Lightwave Technology, May 2004, pp. 1380-1394, vol. 22, No. 5, IEEE.

Bogaerts, Wim et al., "Silicon microring resonators", Laser & Photonics Reviews, 2012, vol. 6, No. 1, pp. 47-73, Wiley Online Library.

Johnson et al., "Tunable 1060 nm VCSEL co-packaged with pump and SOA for OCT and LiDAR", Optical Coherence Tomography and Coherence Domain Optical Methods in Biomedicine XXIII, Proc. of SPIE vol. 1086, 1086706, 2019.

Extended European Search Report with written opinion issued by the European Patent Office for corresponding European Patent Application No. EP 21 16 0867, dated Jul. 6, 2021.

Extended European Search Report with written opinion issued by the European Patent Office for corresponding European Patent Application No. EP 21 16 0865.8, dated Jul. 16, 2021.

Requisition issued by the Canadian Patent Office for Canadian Patent Application No. 3111302, dated Nov. 30, 2023.

First Office Action issued by the Chinese Patent Office for Patent Application No. 202110257222.1 dated May 29, 2024, with English translation attached.

First Office Action issued by the Chinese Patent Office for Patent Application No. 202110258332.X dated May 31, 2024, with English translation attached.

Second Office Action issued by The China National Intellectual Property Administration for Chinese Patent Application No. 202110258332.X, dated Oct. 29, 2024, with English translation attached.

* cited by examiner

TUNABLE LASER ASSEMBLY AND METHOD OF CONTROL

CROSS REFERENCE TO RELATED APPLICATIONS

This application claims the benefit of U.S. Provisional Patent Application No. 62/987,102 filed on Mar. 9, 2020, and U.S. Provisional Patent Application No. 62/989,007 filed on Mar. 13, 2020. The disclosures of U.S. Provisional Patent Application 62/987,102 and U.S. Provisional Patent Application No. 62/989,007 are hereby incorporated by reference.

FIELD OF THE INVENTION

This invention relates generally to semiconductor lasers, and more particularly to tunable semiconductor lasers.

BACKGROUND

Tunable lasers are critical components in many optical imaging and optical sensing systems. High output power, broad tuning, and extremely pure and stable spectral characteristics are required for high-performance systems. Vertical cavity semiconductor lasers (VCSELs) have proven to be good sources for these applications due to their single-frequency, mode-hop-free tuning characteristics which provide for long coherence length laser output. VCSELs differentiate themselves from other types of tunable semiconductor lasers in that the cavity length of the VCSEL is short enough that only one longitudinal mode under the gain curve is available for lasing. This is in comparison with in-plane, edge-emitting tunable lasers where multiple longitudinal modes exist under the gain curve requiring wavelength selective elements to select lasing only one longitudinal mode. The use of light weight micro-electro-mechanical system (MEMS) tuning elements enable high-sweep rates e.g., 10 kHz to 1 MHz over broad tuning ranges e.g., 10 nm to more than 100 nm. VCSELs are also attractive because they are scalable to wafer-level manufacturing and therefore lower cost. Operating wavelengths can include a very wide range, based only upon the availability of semiconductor gain elements and optical Bragg grating reflectors, ranging from ultraviolet (UV) e.g., 250 nm out to many microns, e.g., more than 5 microns.

Implementation of the optical imaging or optical sensing system requires accurate knowledge of the tunable laser wavelength as it sweeps over its tuning range. Many methods have been used to characterize the tunable laser wavelength, including multi-point calibration [1], built-in wavelength meters [2], bandpass filter arrays [3], wavelength discriminator arrays [4], wavelength-to-power calibration [5], etalons [6,7], position sensitive detectors, [8], arrayed waveguide gratings [9] and a series of fiber Bragg gratings [10]. These methods acknowledge that the wavelength tuning characteristics of the tunable laser will vary over time responding to environmental (e.g., temperature, pressure) and aging effects. There can also be short-term sweep-to-sweep variations due to inherent electro-mechanical properties of the tuning elements. Moreover, instantaneous characterization of wavelength becomes more difficult as the sweep rate increases. Modern optical imaging systems, for example such as those used in optical coherence tomography (OCT), employ interferometers to measure the instantaneous laser wavelength. The output from the interferometer interfaces with high-speed data acquisition system enabling compensation for any short-term variations in the laser spectral sweep characteristics. However, it is important that the overall spectral properties of the laser output e.g., center wavelength, optical bandwidth, and spectral shape, remain constant over the operating environment and lifetime of the laser.

The optical output power from single-spatial mode tunable VCSELs is limited by the small cavity size and thermal properties of the semiconductor epitaxial layer structure. Output power in the range of 50 mW or greater are required, particularly to achieve desired signal-to-noise sensitivity as the sweep rate increase to speeds in excess of more than 200 kHz. High output power from the tunable laser also reduces overall system costs by enabling lower cost components and assembly techniques downstream of the tunable laser. For these reasons, it is necessary to increase the output power from the VCSEL using an optical amplifier.

Low cost is also an essential element to enable optical imaging and sensing applications in higher volume consumer markets such as robotic machine vision, autonomous driving, and home health care OCT applications.

The following novel concepts according to embodiments of the present invention provide a highly stable, low cost, tunable laser assembly based on VCSELs and planar lightwave circuits (PLCs). The concepts are applicable to both optically-pumped and electrically-pumped VCSELs

SUMMARY

To create a highly stable, low cost, tunable VCSEL laser assembly, the method for combining the various optical elements that comprise the laser assembly, i.e., the 'packaging platform' should take advantage of photo-lithographically defined, wafer-scale planar optical circuits rather than traditional 'optical bench' packaging platforms. The functions of numerous bulk optical elements (e.g., mirrors, lenses, beam splitters/combiners) can be implemented at lower cost on wafer-scale planar optical circuits with the two-fold advantage of (1) higher spectral stability through implementation of more complex monitoring and control circuits and (2) lower assembly cost through simplified optical alignment. Therefore, the first concept used in the basic design of this highly stable, low cost, tunable VCSEL laser assembly according to an embodiment is to use a wafer-scale planar optical circuit packaging platform.

Many technologies exist for fabricating planar optical circuits, also referred to as planar lightwave circuits (PLCs), including silica-on-silicon, silicon-on-insulator (SOI), and LPCVD silicon nitride. The choice of PLC technology depends highly on the technical requirements of the application (operating wavelength, optical loss, optical non-linearity) as well as the economic requirements (size, cost, production volume). SOI has attracted a lot of attention due to compatibility with CMOS silicon wafer fabrication processes and has enabled the rapidly commercializing field of silicon photonics. However, propagation in silicon waveguides is limited to wavelengths greater than approximately 1.1 μm. Therefore, SOI is not appropriate for typical bioscience or life-science applications in the visible to near-infrared wavelength range (0.4-1.1 μm).

A distinguishing feature of any PLC technology is the amount of lateral waveguide confinement that can be achieved which is related to the refractive index difference between the core and cladding. The so-called 'Δn' or index contrast is defined as $\Delta n=(n_{core}-n_{dad})/n_{dad}$ where $n_{core}$ and $n_{dad}$ are the index of the waveguide core material and cladding material, respectively [11]. The higher the index contrast, the smaller the radius of curvature that is possible for waveguide bends which enables smaller chips or a higher density of optical functions. The disadvantage of higher index contrast is that the bi-refringence of the waveguide increases. Low bi-refringence PLCs can be designed on low index contrast technologies such as silica-on-silicon or ion exchange glass waveguides that have essentially no difference in the propagation characteristics the orthogonal of TE and TM modes, similar to single-mode optical fiber. High index contrast technologies such as SOI and LPCVD silicon nitride, however, can have extremely different propagation characteristics between TE and TM modes such that the PLC is essentially a single-polarization component. The index contrast of the selected PLC technology must be matched to the polarization requirements of the application.

It should be noted that most PLC technologies incorporate a method to actively adjust the characteristics of the various circuit components in order to compensate for fabrication tolerances and in some instances to implement broad wavelength tuning. This adjustment is typically accomplished with on-chip micro-heaters that provide localized heating of the waveguide and thereby change the waveguide index of refraction. The use of micro-heaters is not fundamental to this invention, but both the presence of micro-heaters on the PLC and the ability to adjust/tune circuit components is assumed.

One embodiment of the present invention provides a tunable laser assembly housed in a single enclosure wherein the MEMS-VCSEL chip, pump chip and semiconductor optical amplifier chip are not aligned to each other (do not share a common free-space optical axis) but are all aligned to optical waveguides on an intervening planar lightwave circuit (PLC) chip.

One embodiment of the present invention provides a method for controlling the absolute wavelength and the optical bandwidth of a swept-source tunable laser that uses the timing information from a signal generated by a reference wavelength filter and an optical element that generates signal pulses corresponding to nearly equally spaced wavenumbers.

One embodiment of the present invention provides a stabilized laser including: a tunable semiconductor laser emitting tunable laser radiation; at least one photodetector; at least one reference wavelength filter; at least one optical element that generates signal pulses corresponding to nearly equally spaced wavenumbers; and a closed loop controller; wherein timing information from a signal generated by that at least one reference wavelength filter and the at least one an optical element that generates signal pulses corresponding to nearly equally spaced wavenumbers are input to the closed-loop controller and the closed-loop controller stabilizes the absolute wavelength and optical bandwidth of said tunable laser radiation.

One embodiment of the present invention provides a swept source optical coherence tomography system including: a tunable semiconductor laser emitting tunable laser radiation; at least one photodetector; at least one reference wavelength filter; at least one optical element that generates signal pulses corresponding to nearly equally spaced wavenumbers; and a closed loop controller; wherein timing information from a signal generated by that at least one reference wavelength filter and the at least one an optical element that generates signal pulses corresponding to nearly equally spaced wavenumbers are input to the closed-loop controller and the closed-loop controller stabilizes the absolute wavelength and optical bandwidth of said tunable laser radiation; an OCT interferometer; and an OCT detector; wherein at least a portion of the said tunable laser radiation is directed to the OCT interferometer and the output of the OCT interferometer directed to an OCT detector for generating OCT interferograms.

DETAILED DESCRIPTION OF THE PREFERRED EMBODIMENTS

Figure 1:
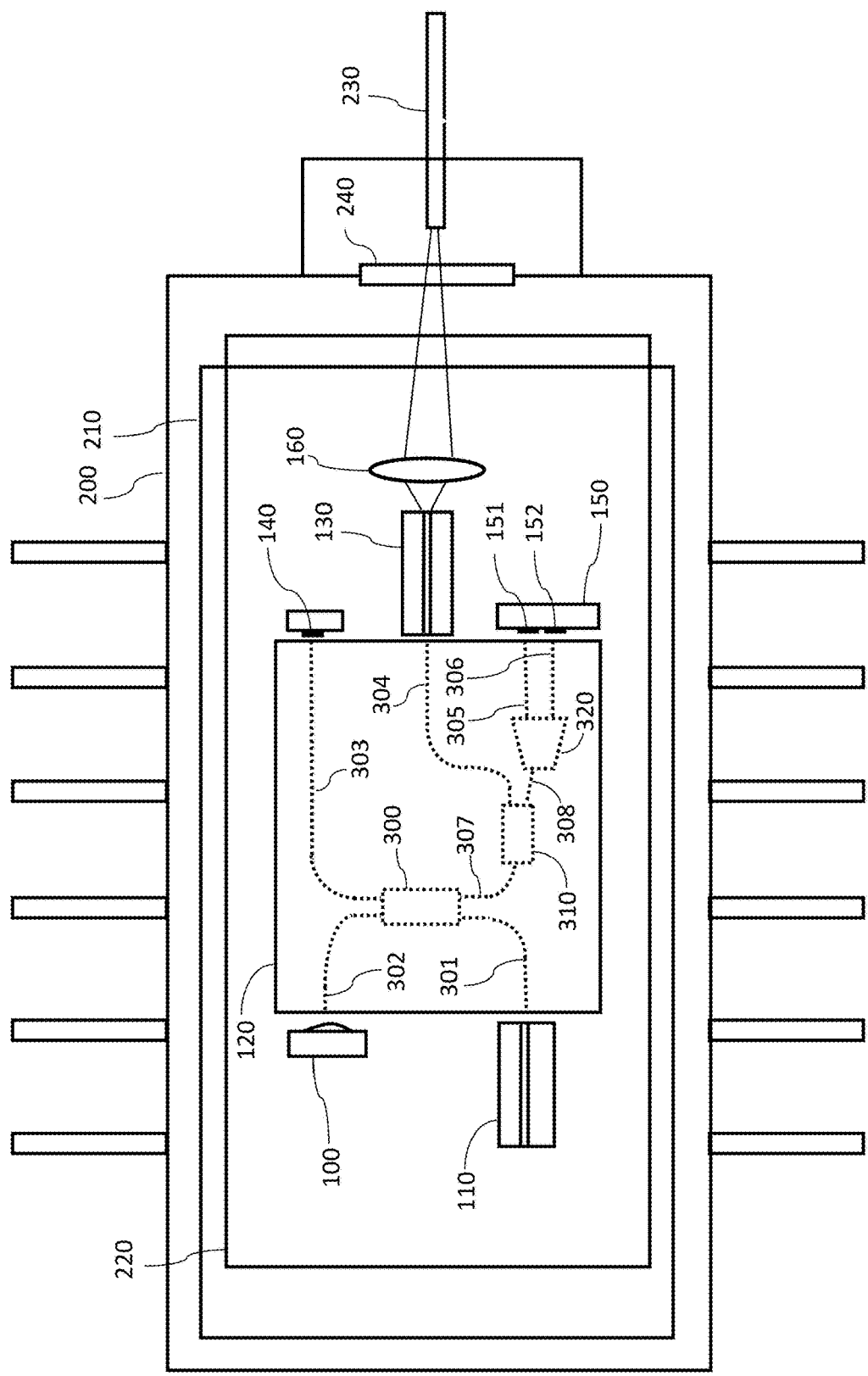
FIG. 1 is schematic diagram of highly stable, low cost, tunable laser assembly design according to an embodiment of the present invention.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the exemplified embodiments. Accordingly, the invention expressly should not be limited to such exemplary embodiments illustrating some possible non-limiting combination of features that may exist alone or in other combinations of features; the scope of the invention being defined by the claims appended hereto.

This disclosure describes the best mode or modes of practicing the invention as presently contemplated. This description is not intended to be understood in a limiting sense, but provides an example of the invention presented solely for illustrative purposes by reference to the accompanying drawings to advise one of ordinary skill in the art of the advantages and construction of the invention. Although some elements disclosed herein are implemented on a chip or chipset without loss of generality, it is understood that many of these elements may also be implemented, for example, on one or more chips and/or one or more optical elements. In the various views of the drawings, like reference characters designate like or similar parts.

FIG. 1 is a schematic of a tunable laser assembly incorporating a MEMS-VCSEL chip, pump laser chip, semiconductor amplifier chip and planar lightwave circuit (PLC) chip all mounted to a common baseplate 220. A TEC 210 under the baseplate on which the semiconductor components are placed controls the temperature. As shown in FIG. 1, a tunable laser assembly according to an embodiment of the present invention includes an enclosure 200 containing a MEMS-VCSEL chip 100 and a PLC chip 120. The laser radiation from the MEMS-VCSEL is coupled to waveguide 302 on the PLC. The laser radiation from the pump chip 110 is coupled to the pump-input waveguide 301 on the PLC and propagates to the MEMS-VCSEL chip via the wavelength division multiplexer (WDM) circuit 300 on the PLC. For efficient operation, the WDM circuit is designed so that a majority of the pump laser radiation propagates to the MEMS-VCSEL chip 100 and a smaller amount propagates via waveguide 303 to the pump monitor photodetector 140. The laser radiation from the optically-pumped MEMS-VCSEL chip in waveguide 302 propagates to the WDM circuit output waveguide 307 and further propagates to the PLC output waveguide 304 via optical power splitter circuit 310. For efficient operation, the WDM circuit 300 is designed so that the majority of the MEMS-VCSEL chip laser radiation in waveguide 302 propagates to the WDM circuit output waveguide 307 and a smaller amount propagates to the pump-input waveguide 301. The optical splitter circuit 310 is designed so that the majority of the MEMS-VCSEL laser radiation propagates to the PLC output waveguide 304 and a smaller amount propagates via waveguide 308 to the wavelength monitoring circuit (WMC) 320. The output laser radiation from the WMC propagates in PLC output waveguides 305 and 306 where the laser radiation is monitored by wavelength monitor photodetectors 151 and 152 mounted on a common substrate 150. The laser radiation from the PLC output waveguide 304 is coupled to the semiconductor optical amplifier chip 130 where the laser radiation is amplified and then propagates through optical lens 160, through the window in the enclosure wall 240 and is coupled into the optical output fiber 230.

For use in demanding imaging applications like OCT, the pump laser chip 110 must be a low-noise, single-frequency laser such a distributed feedback (DFB), distributed Bragg reflector (DBR), volume holographic grating stabilized (VHG), or other external cavity laser. Single-frequency lasers have lower relative-intensity noise (RIN) compared to multi-mode lasers. The pump laser RIN is transferred to the MEMS-VCSEL laser output, so it is important for the pump RIN to be as low as possible, preferably below −135 dB/Hz with a side-mode suppression ratio (SMSR) of 30 dB or greater. For less demanding sensing applications than OCT, it is possible that higher RIN multi-longitudinal mode Fabry-Perot laser pump chips can be used.

Figure 2:
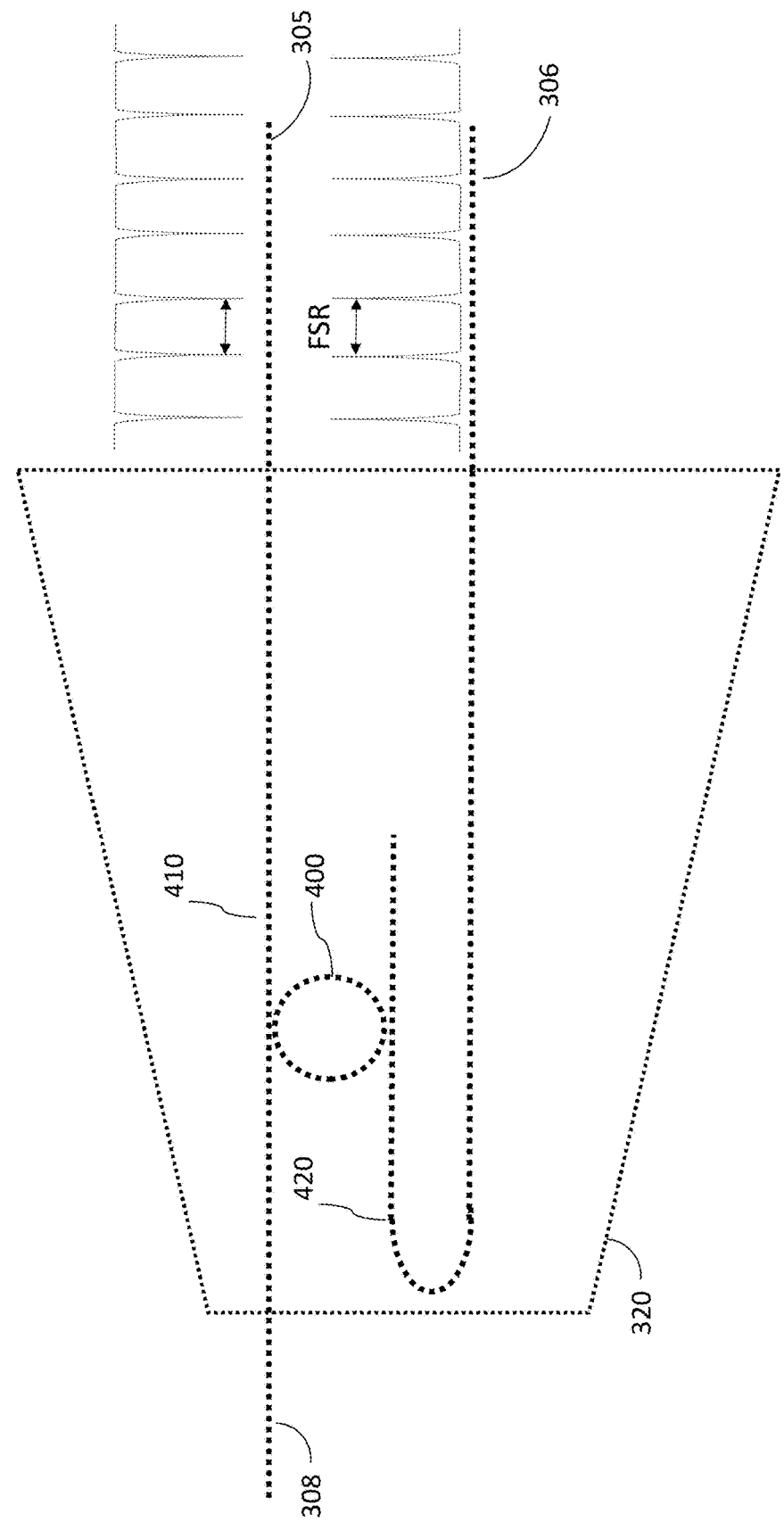
FIG. 2 shows a tunable laser assembly design according to another embodiment of the present invention.

There are many different possible methods for implementing the WMC 320. The embodiment shown in FIG. 2 consists of a single micro-ring resonator (MRR) 400 with the output signals on waveguides 305 and 306 corresponding to the 'through' and 'drop' ports of the MRR, respectively. The term ring resonator is used in this application to indicate any looped resonator design. When the shape is elongated with a straight section, the term 'racetrack' resonator is also used [17]. The MRR in FIG. 2 is shown as a circular loop, but it can also be implemented as a racetrack, or with more complex multi-ring coupled MRR configurations.

Figure 3:
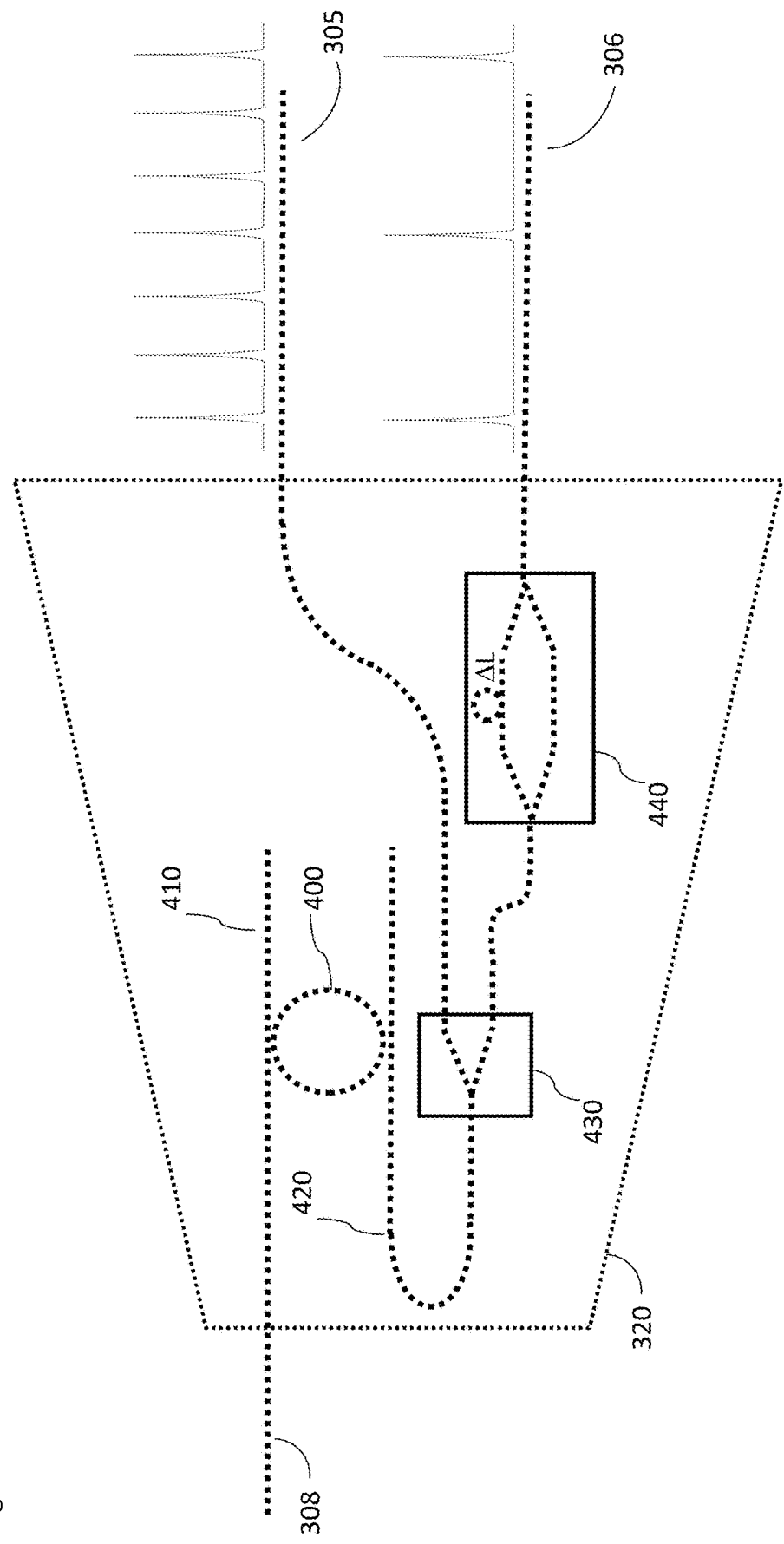
FIG. 3 shows a wavelength monitoring circuit design according to an embodiment of the present invention.

An alternative WMC embodiment, shown in FIG. 3, consists of a MRR followed by an optical splitter 430 and MZI filter 440, both of which are on the 'drop' port of the MRR. The output signal on waveguides 305 corresponds to the 'drop' port of the MRR. The wavelength spacing between the optical pulses on waveguide 305 is determined by the free-spectral range (FSR) of the MRR, which can range from the order of ~1 pm to ~100 nm depending on the radius of the MRR which is determined by the particular PLC implementation technology. For the application of monitoring/controlling the bandwidth of the tunable laser, the FSR of the MRR is desirable to be in the range of 0.1 nm to 10 nm. The output signal on waveguide 306 corresponds to the 'drop' port that has been further filtered by the MZI filter 440 resulting in a reduced number of optical output signals pulses generated as the laser sweeps over its wavelength range. The FSR of the MZI filter, for example, could be designed to be 4 times larger than the FSR of the MRR so that only every $4^{th}$ pulse is transmitted. Multiple MZI filters can also be cascaded to generate more complex filter functions. For the application of monitoring/controlling the center wavelength of the tunable laser, a desirable number of optical pulses is in the range of 1 to 10 pulses as the tunable laser sweeps over its wavelength range.

Figure 4:
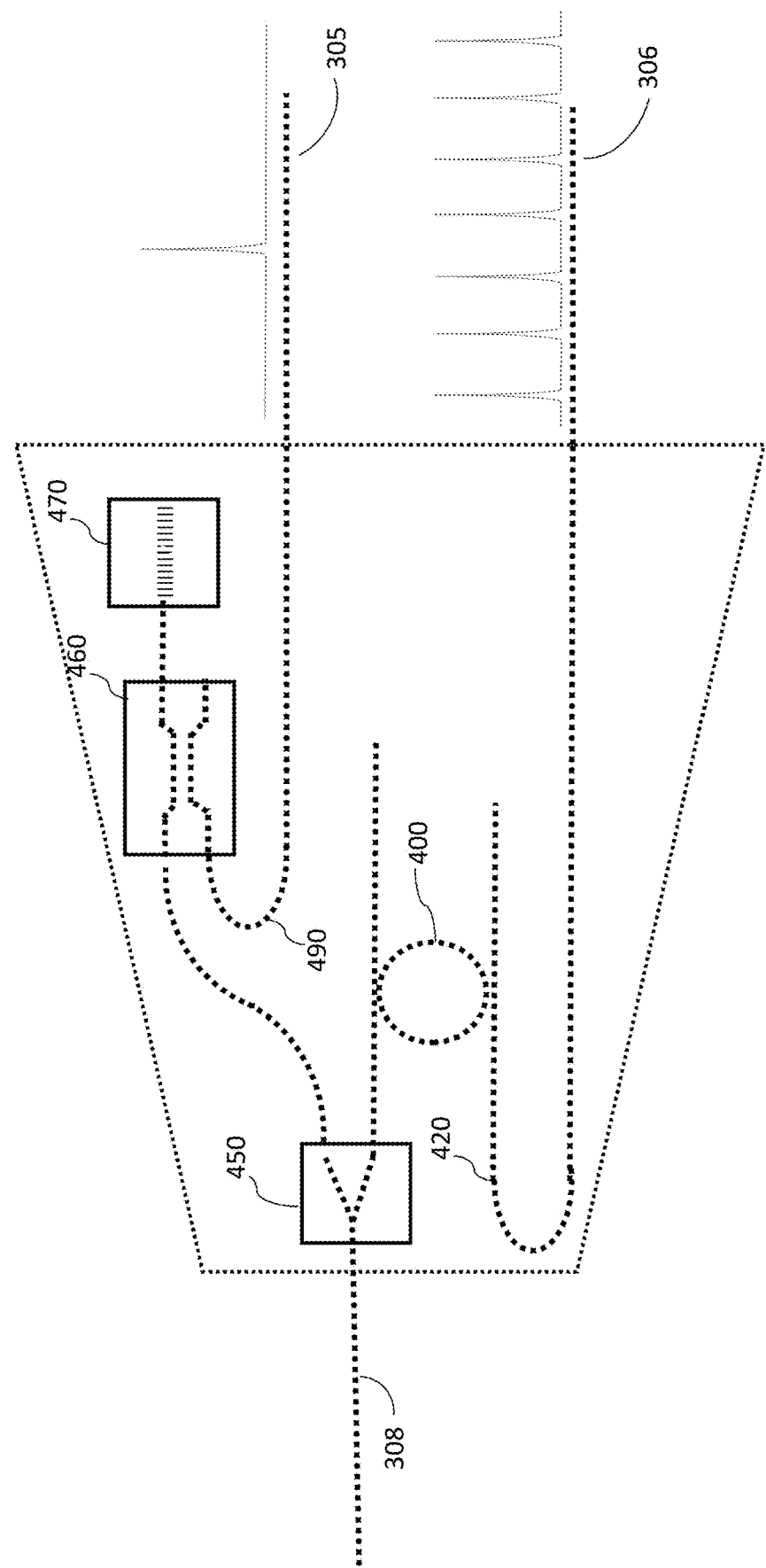
FIG. 4 shows a wavelength monitoring circuit according to another embodiment of the present invention.

Another embodiment of the WMC, shown in FIG. 4, consists of a MRR 400 and an on-chip Bragg grating 470. The input signal to the WMC on input waveguide 308 is divided by optical splitter 450, with some of the optical power is directed to directional coupler 460 and the remaining power is directed to the 'through' port of the MRR 400. One of the outputs of the directional coupler 460 is connected to the Bragg grating 470. The optical signal reflected by the grating propagates to the unused directional coupler input port 490 and becomes the signal in the output waveguide 305. The Bragg grating can be designed to reflect only one wavelength across the tuning range of the tunable laser. For the application of monitoring/controlling the center wavelength of the tunable laser, it is desirable to have the single wavelength pulse located within +/−20 nm of the center wavelength of the tunable laser. The signal in the MRR 'drop' port waveguide 420 becomes the signal out the output waveguide 306 and can be used for monitoring/controlling the bandwidth of the tunable laser.

Figure 5:
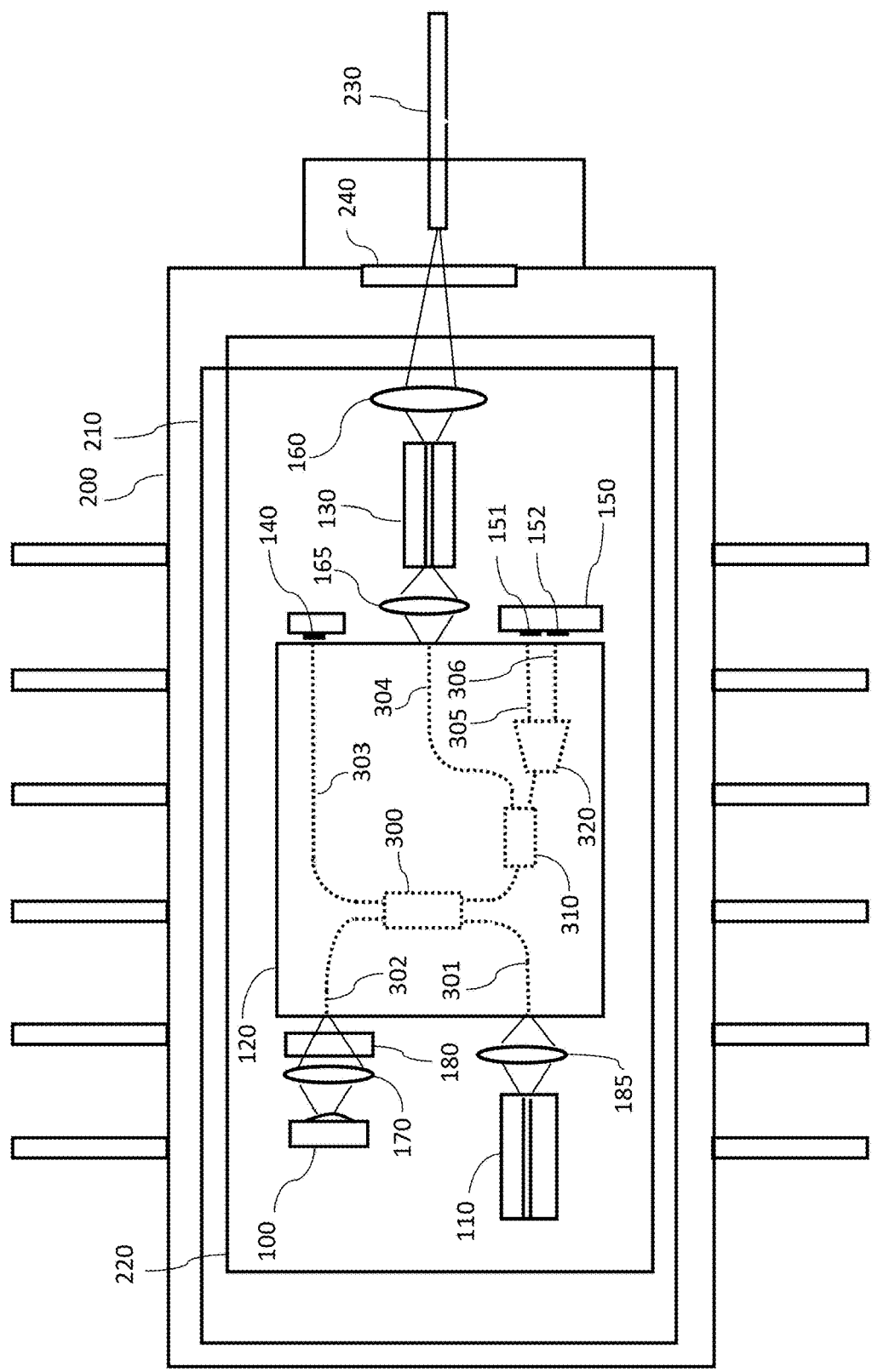
FIG. 5 a wavelength monitoring circuit to another embodiment of the present invention.

Those skilled in the art will recognize that there are many methods by which the laser radiation to/from the semiconductor components (i.e., MEMS-VCSEL, pump, SOA, photodetectors) can be coupled to/from the PLC. The embodiment shown in FIG. 1 indicates direct butt-coupling between the semiconductor components and the PLC optical waveguides. In a second embodiment of the present invention, shown in FIG. 5, optical lenses 170, 185, and 165 couple the MEMS-VCSEL, pump, and SOA to the PLC, respectively. One skilled in the art will also recognize that the function of a single lens can also be implemented with more complex multi-element lens configurations. One of the benefits of using a lens to couple the MEMS-VCSEL to the PLC waveguide is that a quarter-wave ($\lambda/4$) polarization waveplate 180 can be inserted between the MEMS-VCSEL 100 and the MEMS-VCSEL input waveguide 302. Orienting the polarization axis of the $\lambda/4$-waveplate at 45 degrees to the preferred polarization axis of the PLC prevents the pump light that is reflected from the MEMS-VCSEL from propagating back to the pump laser chip because the reflected pump light is orthogonal to the preferred polarization of the PLC and is therefore highly attenuated. Similarly, this configuration of the $\lambda/4$-waveplate in combination with the preferred polarization axis of the PLC prevents backwards propagating laser radiation from the SOA (e.g., amplified spontaneous emission (ASE) and/or amplified reflected signal) that reflects from the MEMS-VCSEL from propagating forward in the PLC and setting up a potential laser cavity between the SOA and the MEMS-VCSEL.

Figure 6:
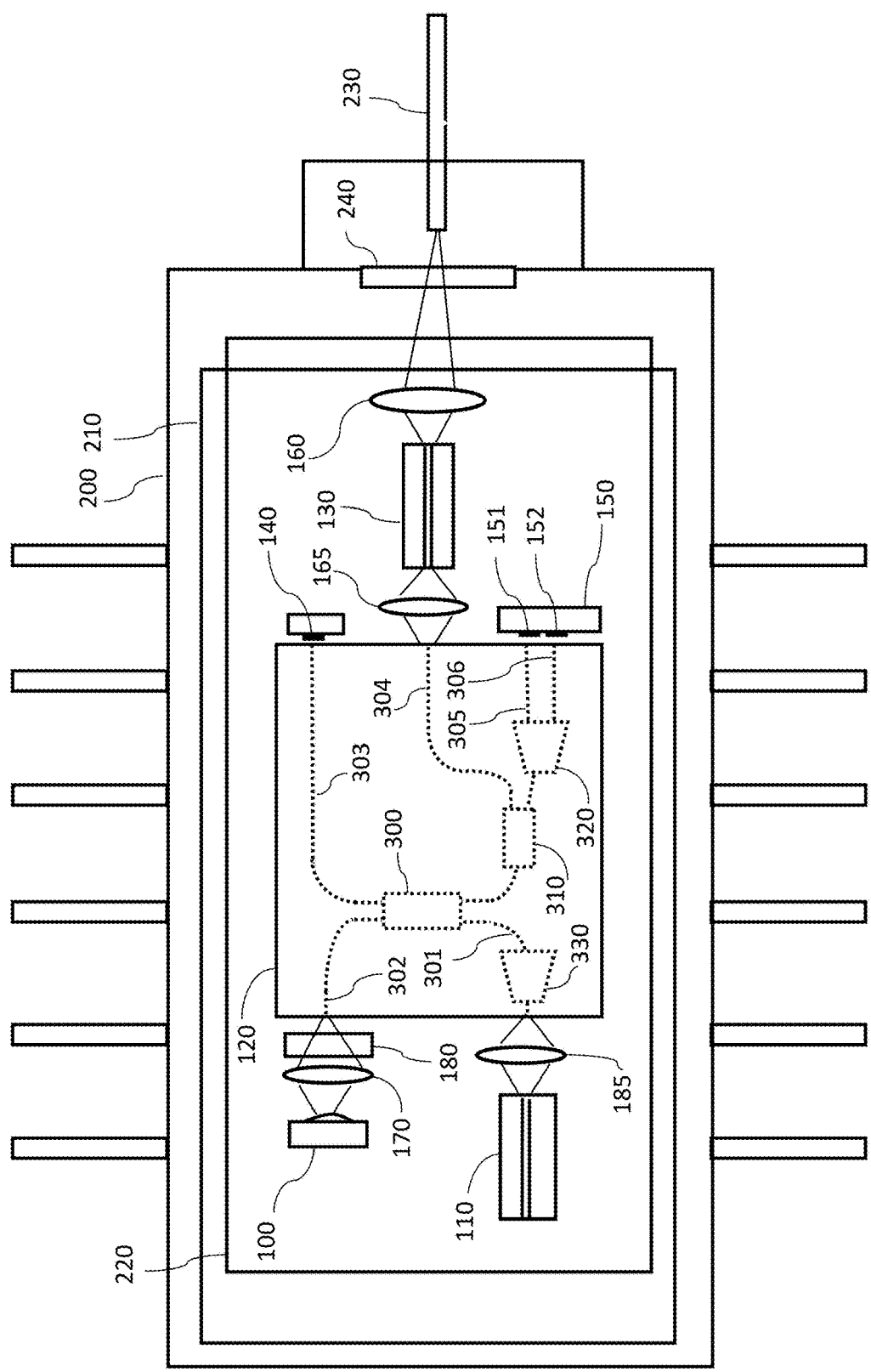
FIG. 6 shows a tunable laser assembly design according to another embodiment of the present invention.

In another embodiment of the present invention, shown in FIG. 6, an external cavity reflector (ECR) circuit 330 is implemented on the PLC to form an external cavity laser in combination with the pump chip 110. In this case, the pump chip would typically have an anti-reflection coating the facet facing the PLC. Narrow-band reflection from the ECR circuit creates and a narrow-linewidth, single-frequency laser for low-noise pumping of the MEMS-VCSEL. Those skilled in the art will recognize that there are many ECR circuits, for example Bragg gratings [12] or micro-ring resonators [13] that can be implemented on PLCs to create an external cavity laser.

Figure 7:
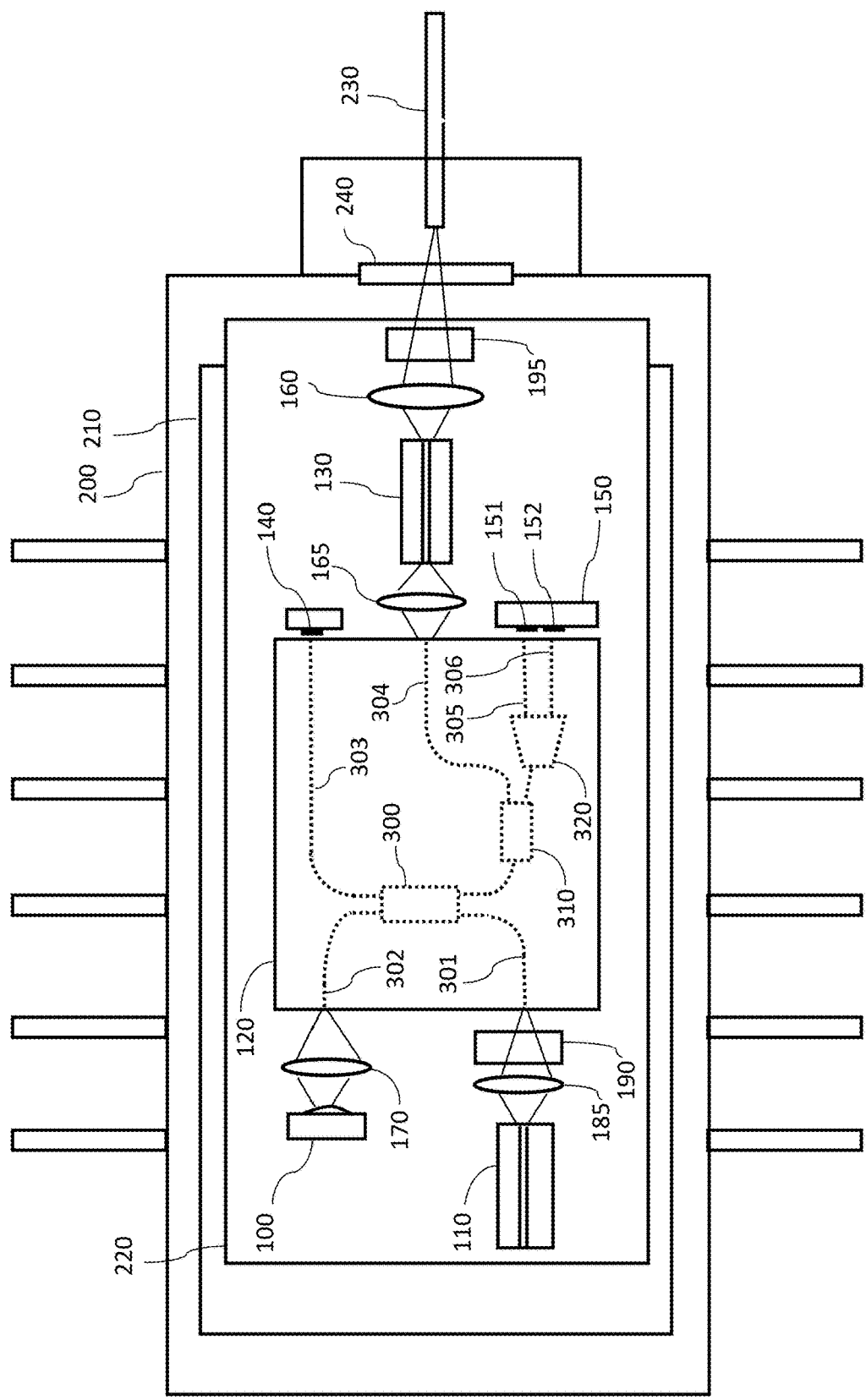
FIG. 7 shows a tunable laser assembly design according to another embodiment of the present invention.

In another embodiment of the present invention, shown in FIG. 7, an optical isolator 190 is placed between the pump laser chip 110 and the pump-input waveguide 301. This isolator prevents pump light that is reflected from the MEMS-VCSEL from propagating back to the pump laser chip. An output isolator 195 is also placed between the SOA 130 and the optical fiber 230 to prevent reflections from propagating back to the SOA.

Figure 8:
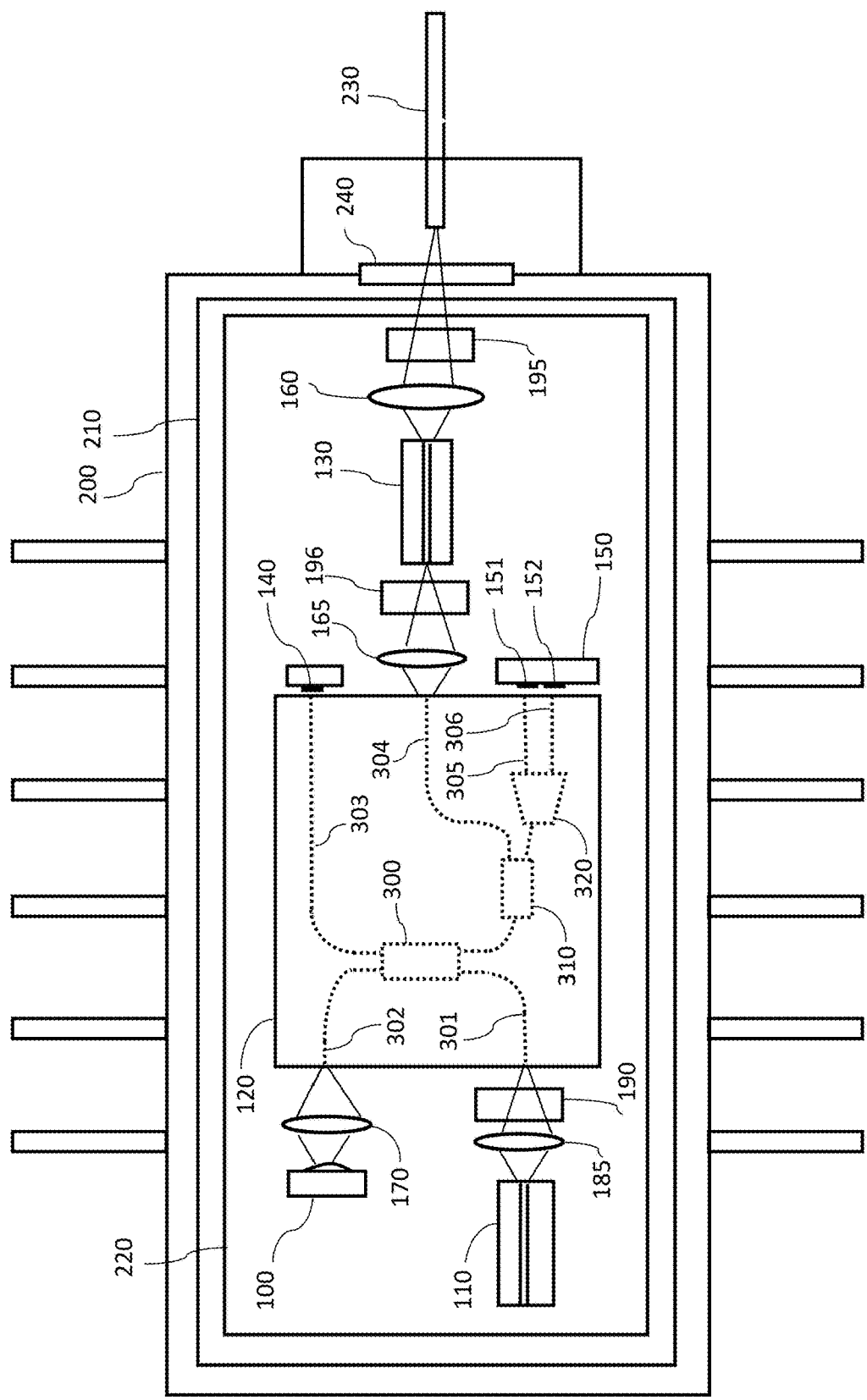
FIG. 8 shows a tunable laser assembly design according to another embodiment of the present invention.

In another embodiment of the present invention, shown in FIG. 8, and optical isolator 196 is placed between the PLC output waveguide 304 and the SOA. This isolator prevents backwards propagating laser radiation from the SOA that reflects from the MEMS-VCSEL from setting up a potential laser cavity between the SOA and the MEMS-VCSEL.

Figure 9:
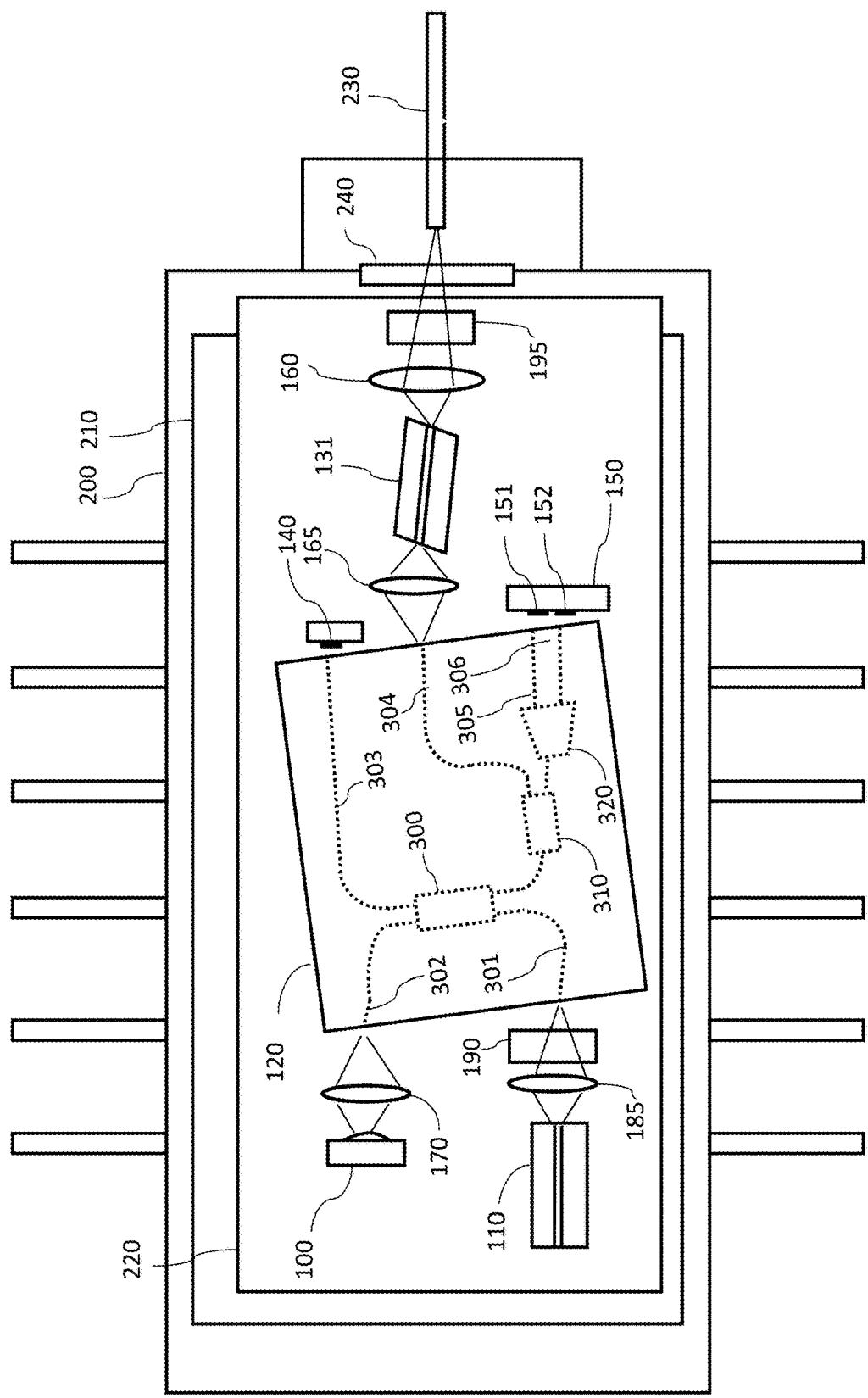
FIG. 9 shows a tunable laser assembly design according to another embodiment of the present invention.

Those skilled in the art will recognize that angled interfaces are often used in order to reduce reflections between optical components. In another embodiment of the present invention, shown in FIG. 9, the input and output PLC waveguides (301, 302, 303, 304, 305, 306) intersect the chip facet at an angle, as does the waveguide on the SOA 131.

Figure 10:
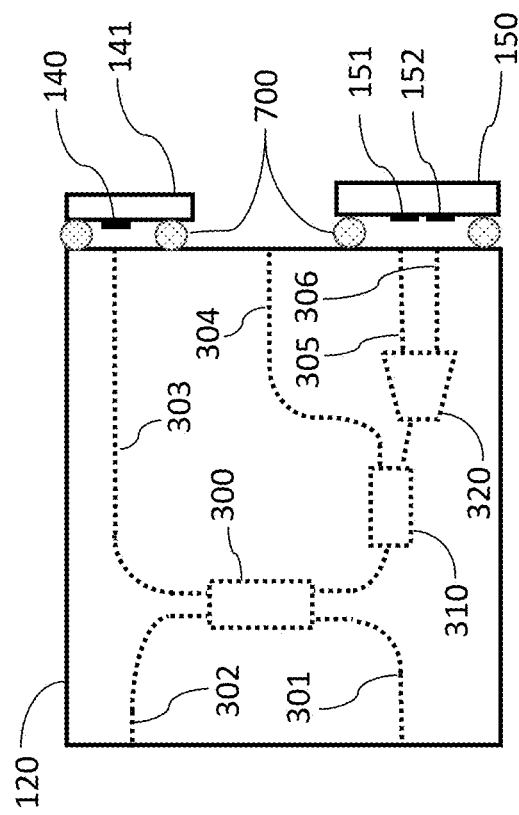
FIG. 10 shows an assembly method for integrating photodetectors in the tunable laser assembly according to an embodiment of the present invention.

In another embodiment of the present invention, shown in FIG. 10, the photodetectors are attached directly to the PLC. The pump monitor photodiode 140 is mounted on a substrate 141 which is attached to the side of the PLC using glue 700 or similar attachment material. Similarly, wavelength monitor photodetectors 151 and 152 are mounted on a common substrate 150 which is attached the side of the PLC using glue 700 or similar attachment material.

Figure 11:
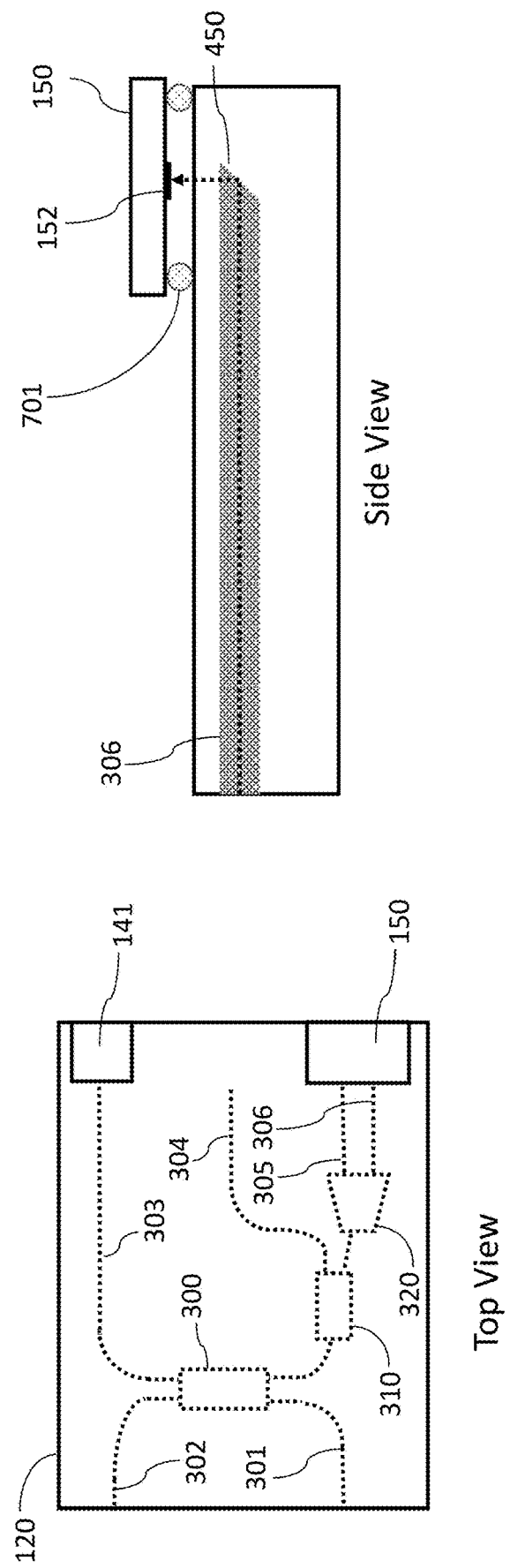
FIG. 11 shows an assembly method for integrating photodetectors in the tunable laser assembly according to another embodiment of the present invention.

In another embodiment of the present invention the photodetectors are attached directly to the PLC via flip-chip integration. The photodiode substrates 141 and 150 are mounted on top surface of the PLC, as shown in the top view in FIG. 11, and attached using solder 701 or other attachment material as shown in the side view in FIG. 8. Light in the optical waveguide 306 is directed on to the photodetector 152 by a turning mirror 450 or other method of reflecting the beam upwards approximately normal to the PLC top surface. A surface grating, for example, is another method to reflect the optical beam from the waveguide up to the photodetector.

Figure 12:
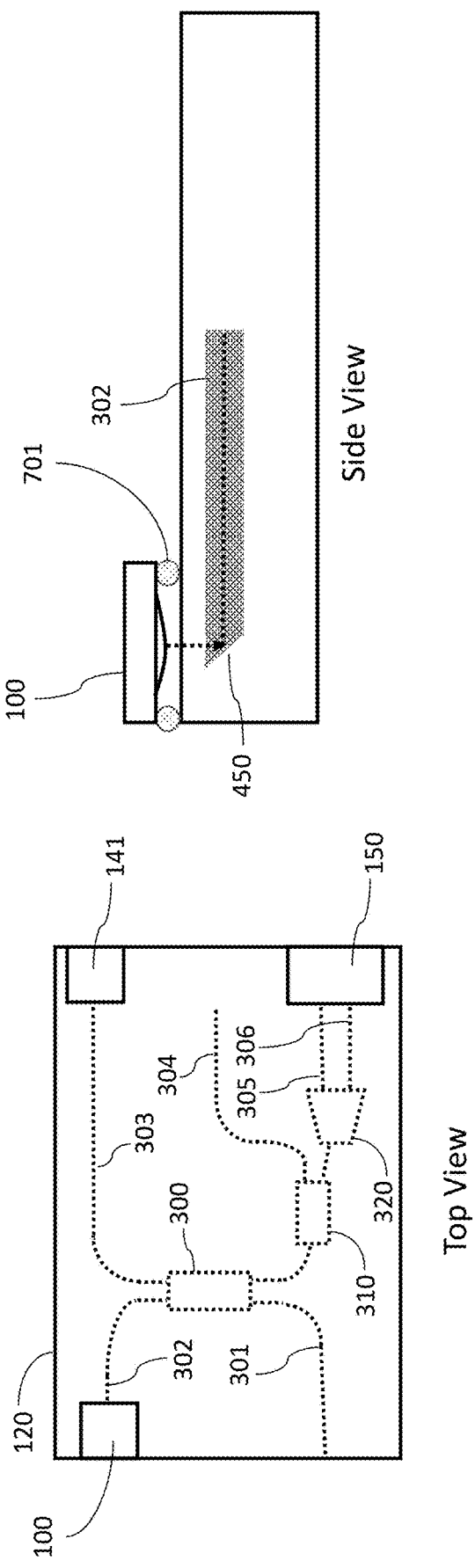
FIG. 12 shows an assembly method for integrating a MEMS-tunable VCSEL in the tunable laser assembly according to an embodiment of the present invention.

In another embodiment of the present invention the MEMS-VCSEL is attached directly to the PLC via flip-chip integration. The MEMS-VCSEL 100 is mounted on top surface of the PLC, as shown in the top view in FIG. 12, and attached using solder 701 or other attachment material as shown in the side view in FIG. 12. Light from the MEMS-VCSEL is directed into the optical waveguide 302 by a turning mirror 450 or other method of coupling into the waveguide. A surface grating, for example, is another method to couple the optical beam from the MEMS-VCSEL into the waveguide.

Figure 13:
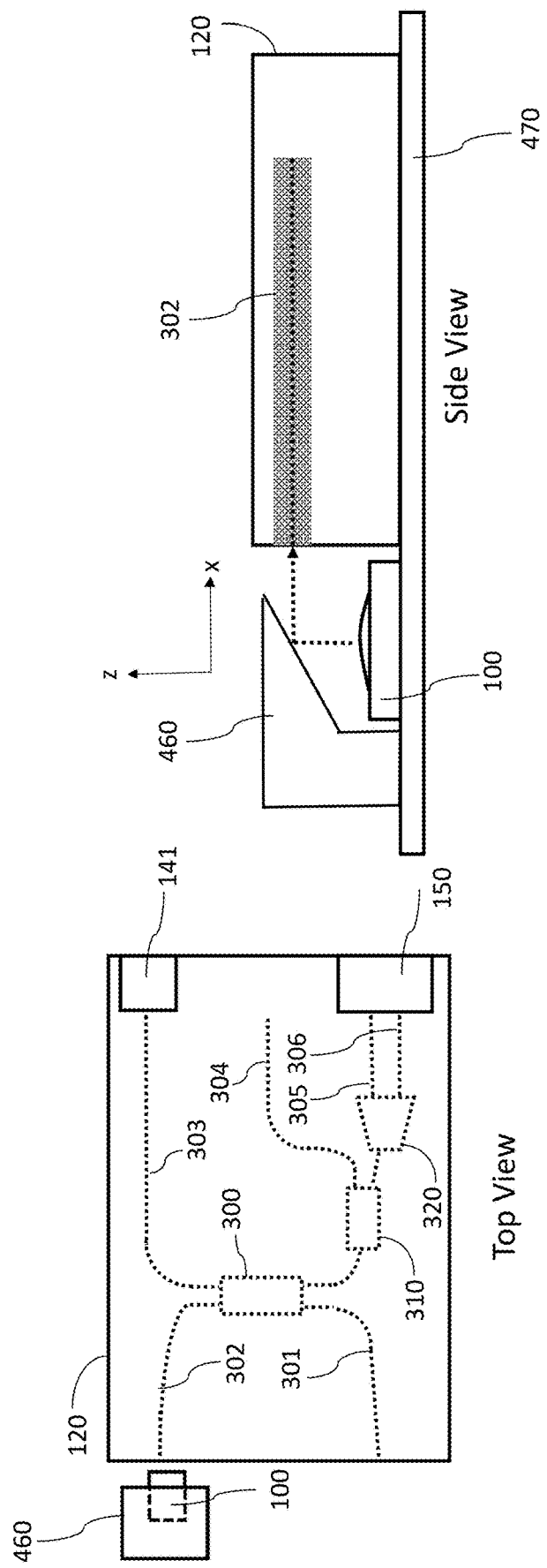
FIG. 13 shows an assembly method for integrating a MEMS-tunable VCSEL in the tunable laser assembly according to another embodiment of the present invention.

In another embodiment of the present invention the optical signal from MEMS-VCSEL coupled to the PLC via an external turning mirror that enables vertical alignment of the optical signal to the PLC waveguide by lateral adjustment of the turning mirror. The MEMS-VCSEL 100 is mounted on a common substrate 470 with the PLC chip 120, as shown in the top view in FIG. 13. The vertical (i.e., normal to the PLC waveguide propagation plane) surface emission of MEMS-VCSEL is converted into the horizontal (i.e., parallel to the PLC waveguide propagation plane) direction via the turning mirror 460. Precise vertical alignment (z-axis direction) of the MEMS-VCSEL optical beam to the PLC input waveguide 320 can be accomplished by adjustment of the turning mirror along the x-axis direction. This skilled in the art will recognize that the reflecting surface of the turning mirror 460 can be designed to act as a lens to focus the light into the PLC input waveguide 320, or that a bulk lens can be placed in between the MEMS-VCSEL and the PLC input waveguide to improve the coupling efficiency.

Figure 14:
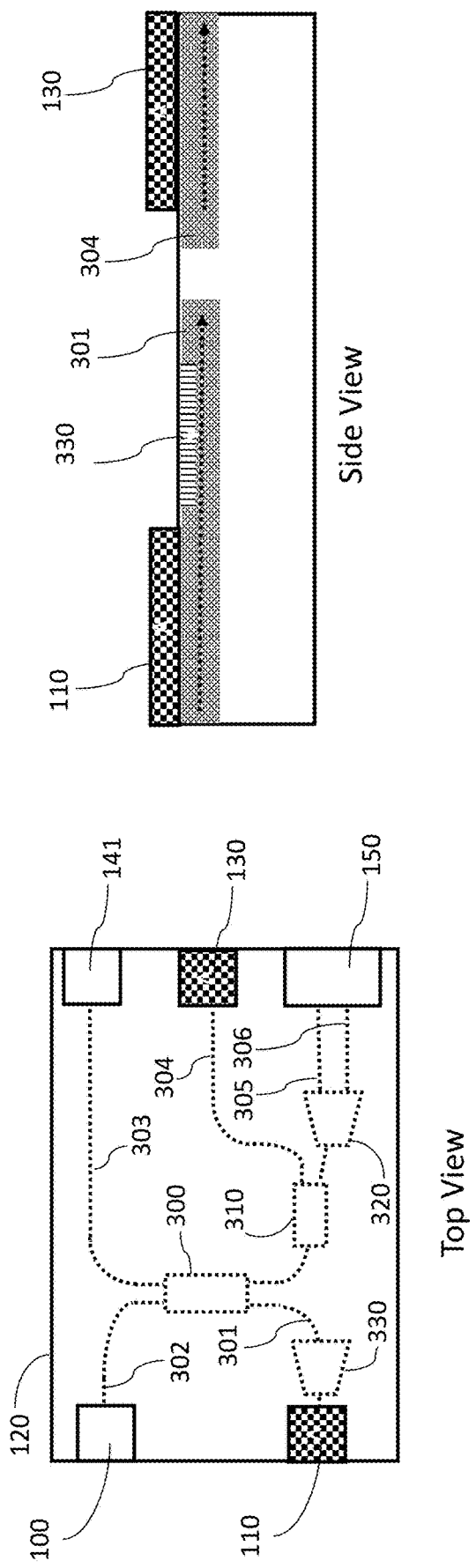
FIG. 14 shows an assembly method for heterogeneous integration of the pump laser and semiconductor optical in the tunable laser assembly according to another embodiment of the present invention.

In another embodiment of the present invention the pump laser and SOA are hybrid or heterogeneously integrated on the PLC. The pump laser 110 and SOA 130 are mounted on the top surface of the PLC, as shown in the top view in FIG. 13 and bonded to the PLC as shown in the side view in FIG. 14. There are various techniques for integration of the III-V materials that comprise the pump and SOA active regions with the PLC. In recent years, 'heterogenous' is more commonly used to describe bonding of III-V chips on a wafer with coarse alignment and subsequently processed at the wafer level, 'hybrid' is more commonly used for soldering or bonding individual functional die on a common substrate [14]. Heterogeneous integration enables high-performance, narrow-linewidth extended cavity DFB, DBR [15] or micro-ring resonator lasers by coupling the active region of the pump laser 110 to the ECR circuit 330, which in FIG. 14 is shown as a Bragg grating.

Figure 15:
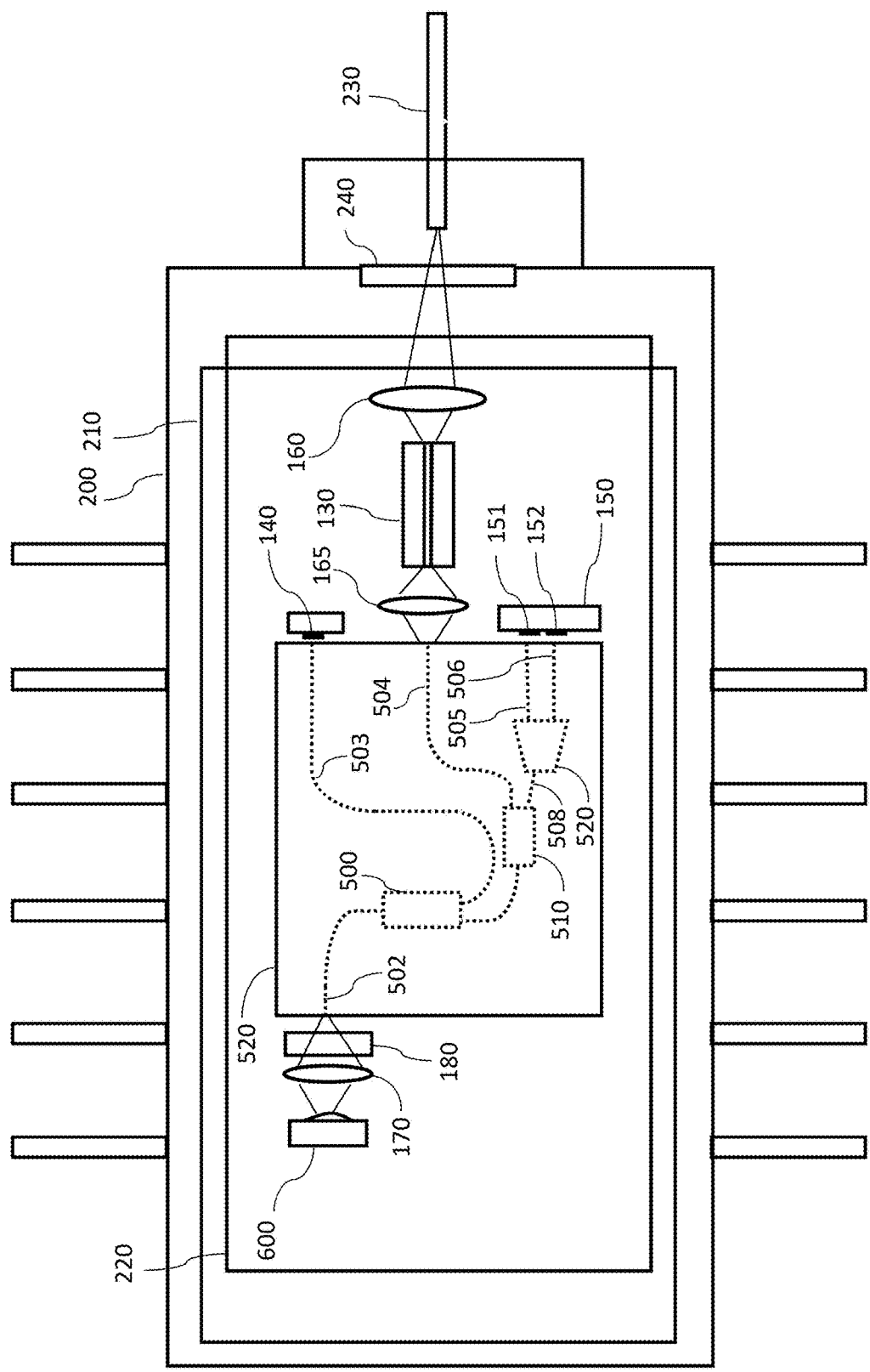
FIG. 15 shows an electrically-pumped VCSEL tunable laser assembly design according to another embodiment of the present invention.

Whereas all the previous embodiments have considered an optically-pumped MEMS-VCSEL, the present invention is also applicable to an electrically-pumped MEMS-VCSEL. One embodiment of an electrically-pumped tunable MEMS-VCSEL according the present invention is shown in FIG. 15. In the case of the electrically pumped MEMS-VCSEL, the WDM component is replaced with an optical splitter 500. The laser radiation from the electrically-pumped MEMS-VCSEL chip 600 in waveguide 502 propagates to the optical splitter 500 and further propagates to the PLC output waveguide 504 via optical power splitter circuit 510. A small sample of the laser radiation propagates to the output power monitor photodetector 140 via waveguide 503. The optical splitter circuit 510 is designed so that the majority of the MEMS-VCSEL laser radiation propagates to the PLC output waveguide 504 and a smaller amount propagates via waveguide 508 to the wavelength monitoring circuit (WMC) 520. The output laser radiation from the WMC propagates in PLC output waveguides 505 and 506 where the laser radiation is monitored by wavelength monitor photodetectors 151 and 152 mounted on a common substrate 150. The laser radiation from the PLC output waveguide 504 is coupled to the semiconductor optical amplifier chip 130 where the laser radiation is amplified and then propagates through optical lens 160, through the window in the enclosure wall 240 and is coupled into the optical output fiber 230.

All previous embodiments described for the optically pumped MEMS-VCSEL apply to the electrically-pumped MEMS-VCSEL. Namely, the WMC 520 has the embodiments described for WMC 320 (FIGS. 2-4). The use of butt coupling (FIG. 1), lens coupling (FIG. 5), quarter-wave polarization plate to provide optical isolation for the MEM-VCSEL (FIG. 5), angled waveguides (FIG. 9), hybrid and heterogeneous integration (FIGS. 10-14) are all embodiments the can be implemented with an electrically-pumped MEMS-VCSEL.

There are several possible methods to use the signals generated by the WMC 320 to control the absolute wavelength (center wavelength) and tuning bandwidth, respectively. Open loop operation of a MEMS-VCSEL swept laser sources presents many challenges in maintaining a stable output over long operating time frames and/or changing environmental conditions. Long term charging effects in the MEMS structure lead to changes in the effective voltage that is applied to the device. As the MEMS structure is an electrostatically-controlled moving membrane, the relationship between the voltage on the electrodes and the mirror position is highly non-linear. Slight changes in operating DC level can result in large changes to the sweep profile and ultimately the overall bandwidth that is contained within a given time window. Additionally, the mechanical damping of the device is highly sensitive to the surrounding environment. Open-loop calibration/corrections can be applied, but these require extensive production characterization procedures and long-term testing.

Figure 16:
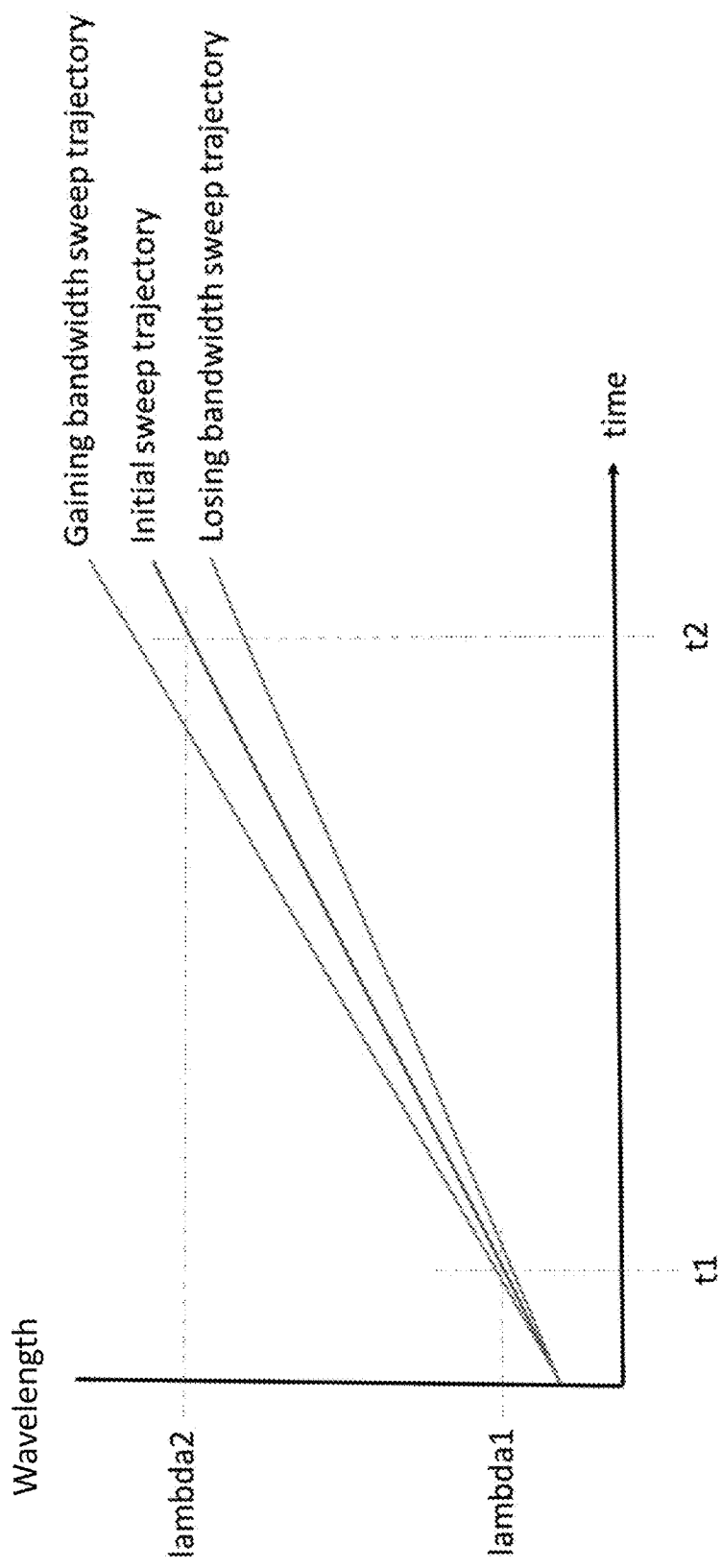
FIG. 16 shows the influence of changes in the tunable laser sweep velocity on the optical bandwidth.

To enable robust and long-term operation it is desired that an optical reference signal be used to monitor and subsequently control the high voltage drive signals to the tunable MEMS-element such that the swept bandwidth (the 'optical bandwidth', or 'bandwidth') is maintained under all operating conditions and timeframes. This optical signal is used to generate timing information which has a direct correlation to the bandwidth and overall sweep trajectory. The typical mechanism for bandwidth loss or gain is mainly that the sweep velocity changes, as illustrated in FIG. 16. As the defined active sweep period is typically fixed by other system parameters, any shift in the sweep velocity directly results in a change in the overall sweep bandwidth within a given time window. Under this assumption, it can be shown that controlling the time difference (t2-t1 in FIG. 16) required to sweep a defined bandwidth (lambda2-lambda1 in FIG. 16) is sufficient to maintaining the overall bandwidth of the tunable swept-source MEMS-VCSEL.

Figure 17A:
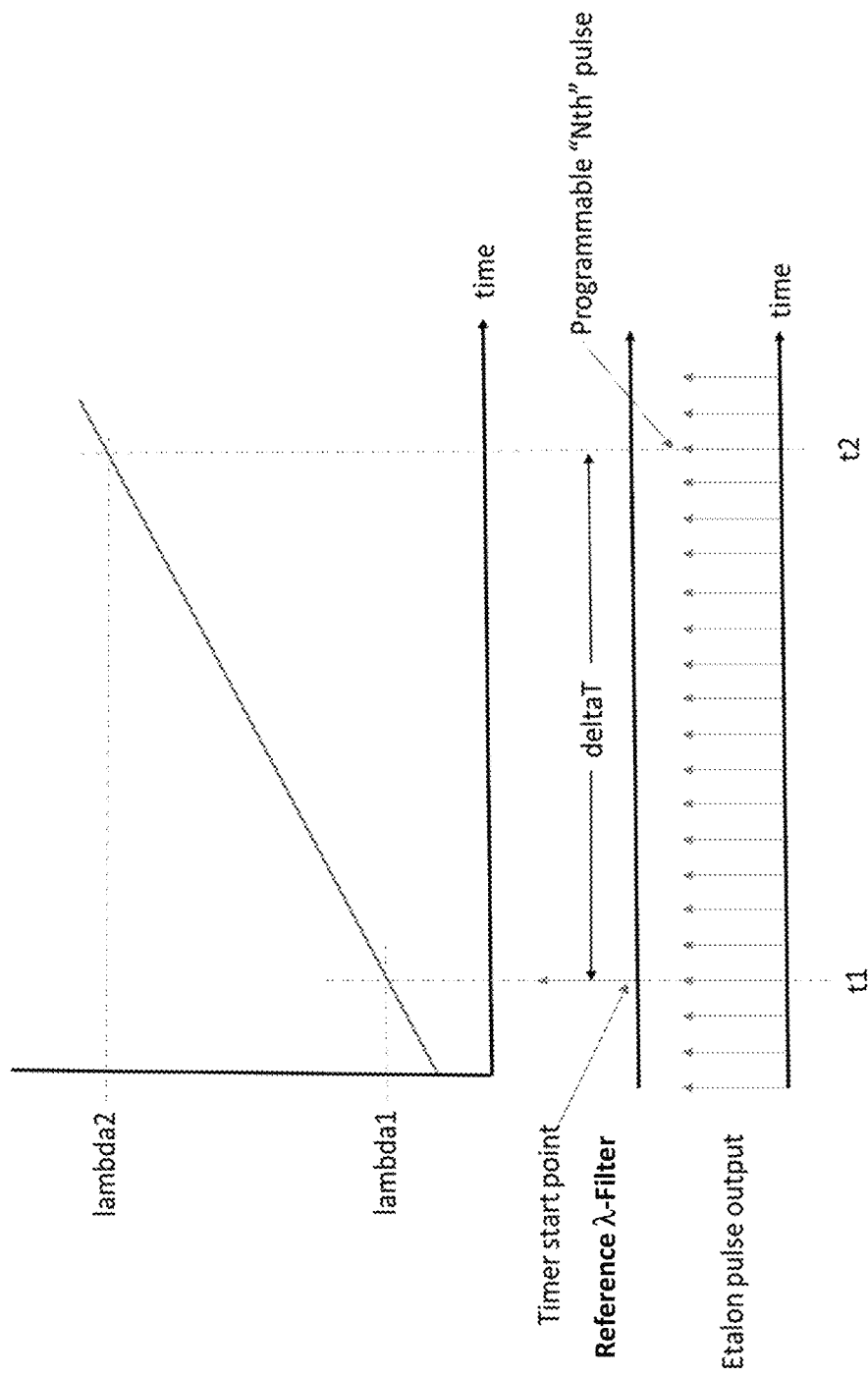
FIG. 17A shows a method of controlling the tunable laser sweep bandwidth and tuning trajectory by monitoring the timing of optical etalon pulses relative a timer starting point generated by a reference-wavelength filter.
Figure 17B:
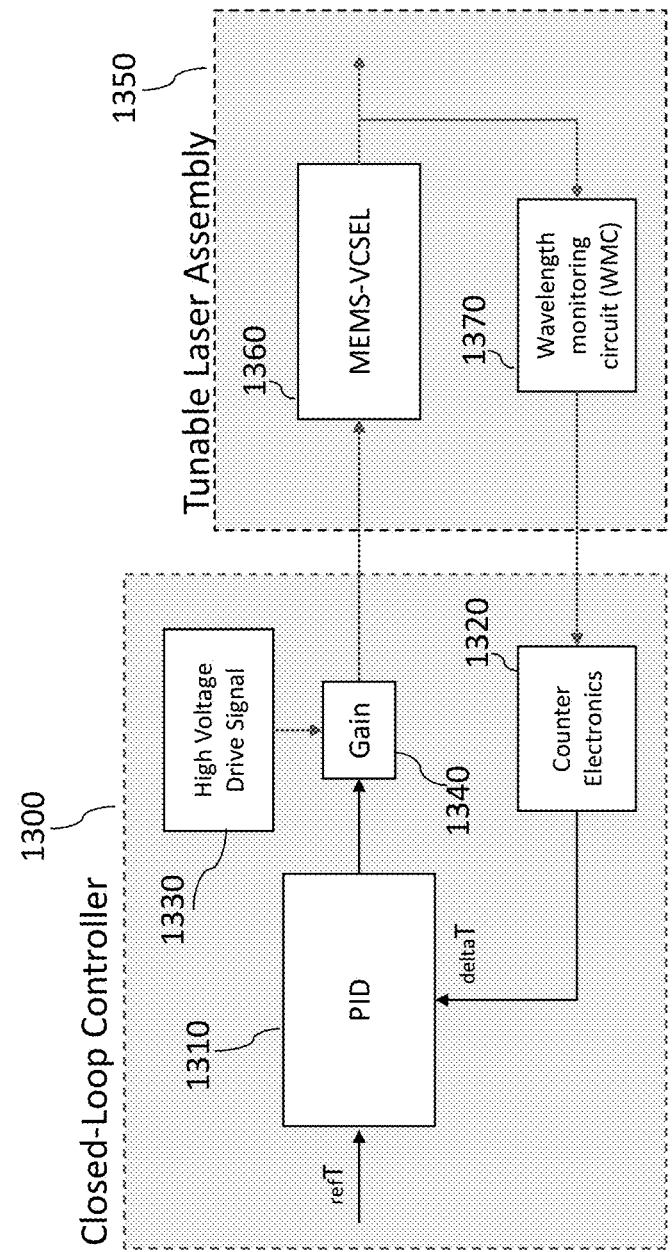
FIG. 17B is a schematic diagram of a highly stable tunable laser with a closed-loop controller according to an embodiment of the present invention.

An optical etalon can be used to generate electrical pulses (via zero crossing detection) each of which correspond to nearly equally spaced wavenumbers. An electronic counter circuit can then be used to generate a measure of the time (deltaT) required for the device to move from a starting wavenumber to an ending wavenumber, as shown in FIG. 17A. The counter electronics combined with the etalon allow a very fine resolution and adjustable timing "marker" to be placed at an ideal location within the sweep trajectory by selecting a programmable 'Nth' pulse as the control marker. This implementation for marking the sweep endpoint is highly advantageous compared to using fixed-wavelength reference component, such a fiber Bragg grating (FBG), notch filter, or bandpass filter, which are not flexible enough to select a proper end-point for all MEMS-VCSEL devices, due to variation in absolute sweep wavelength, difference in sweep rates, and/or different bandwidth requirements. For ensuring absolute wavelength accuracy, the timer starting point (t1, lambda1) is generated by the Reference λ-Filter while the second timing marker (t2) is generated by the etalon, selecting the appropriate 'Nth' pulse to use for bandwidth control. The deltaT generated by the counter electronics 1320 may be used as feedback in a proportional-integral-derivative control algorithm (PID) to implement a closed-loop controller 1300, as shown in FIG. 17B. The PID 1310 measures the difference between the deltaT and a reference time corresponding to the desired bandwidth (refT). Tuning coefficients are applied to this difference generating a PID output that adjusts the gain 1340 of the high voltage signal 1330 driving the MEMS-VCSEL 1360 in the tunable laser assembly 1350. This minimizes the difference between deltaT and refT, maintaining the desired optical bandwidth.

One embodiment to implement the center wavelength and optical bandwidth control method described in the previous section is the integrated WMC circuit shown in FIG. 4. In this example, the timer starting point (t1, lambda1) is generated by the integrated Bragg grating Reference λ-Filter 470 while the second timing marker (t2) is generated by the etalon pulses from the MRR 400, selecting the appropriate 'Nth' pulse to use for bandwidth control. The MRR serves as the optical etalon, providing optical pulses in the MRR 'drop' port waveguide 420 in similar manner to the transmitted signal through a bulk optical etalon. Resonances occur in the transmission spectrum of the MRR when the perimeter of the ring, L, is an integral number of wavelengths (L=2πr for a circular ring of radius r). The resonances are spaced by $FSR_{MRR}=c/n_gL$, where $n_g$ is the group index of the waveguide, $n_g=n_{eff}+f_o(dn_{eff}/df)$, with $f_o$=optical frequency=$c/\lambda_o$ where $\lambda_o$ is the vacuum wavelength [16].

Figure 18:
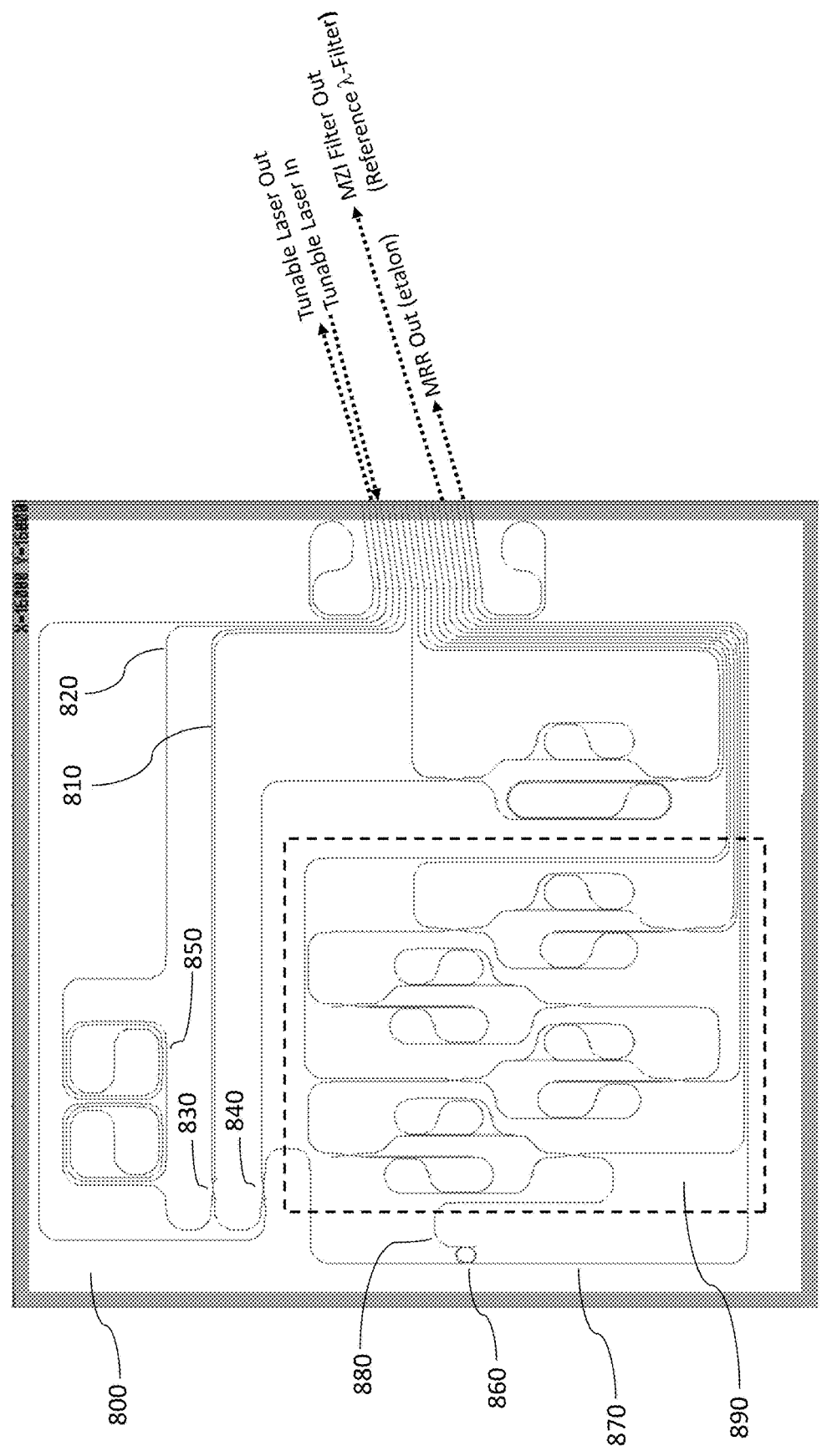
FIG. 18 shows the design of a PLC wavelength monitoring circuit according to another embodiment of the present invention that utilizes a micro-ring resonator to generate the optical etalon pulses and a 4-stage cascaded MZI filter to generate the reference-wavelength filter signal.
Figure 19B:
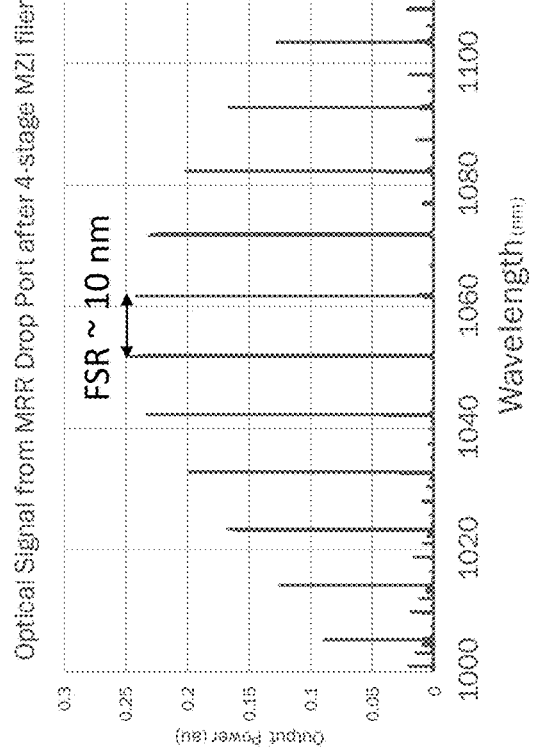
FIGS. 19A and 19B show experiments data measured for the PLC design described in FIG. 18.
Figure 19A:
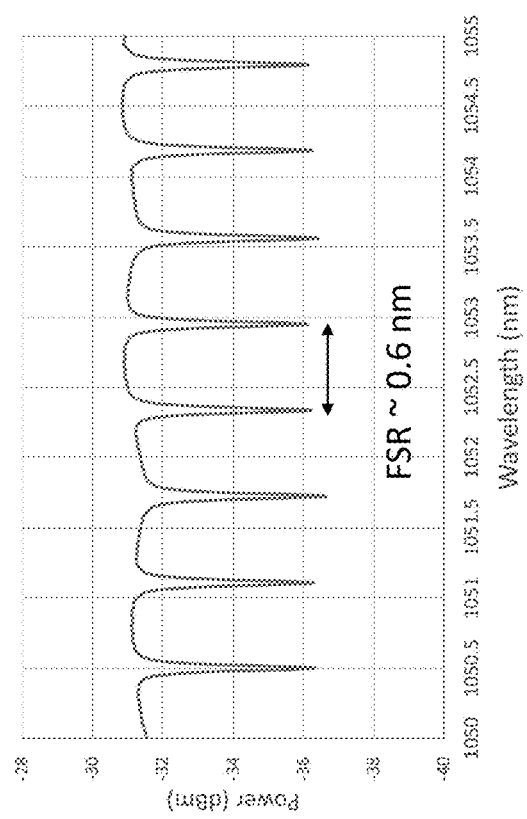

Another embodiment to implement the center wavelength and optical bandwidth control method described previously is the integrated optical circuit PLC chip shown in FIG. 18. The optical signal from the tunable laser enters the PLC on the input waveguide 810. The majority of the laser input signal is directed by the optical directional coupler 830 through a sequence of spiral waveguides 850 and exits the chip via the output waveguide 820. The spiral waveguides have a radius of curvature designed to have low loss for the fundamental propagating waveguide mode (i.e., TE mode) and to have high loss for radiation propagating in a polarization orthogonal (i.e., TM mode) to the fundamental propagating polarization mode. The purpose of the spiral waveguides is to strip off any of the unwanted radiation propagating in the polarization orthogonal to the fundamental polarization mode and prevent cross-coupling between the two polarization modes that would cause an artifact in the OCT image. A smaller portion of the laser input signal is directed by directional couplers 830 and 840 to the integrated MRR 860. The MRR serves as the optical etalon, providing optical pulses in the MRR 'thru' port waveguide 870 in similar manner to the transmitted signal through a bulk optical etalon. The measured optical signal from the MRR thru port is shown in FIG. 19A. The MRR in this particular implementation was designed to have an FSR of approximately 0.6 nm. The reciprocal optical pulses in the MRR 'drop' port waveguide 880 is transmitted through a 4-stage MZI filter 890 that is designed to block the transmission of the MRR optical pulses except those spaced approximately 10 nm apart. The measured optical power at the output of the 4-stage MZI filter is shown in FIG. 19B. In this embodiment, the timer starting point (t1, lambda1) is generated by selecting one of the pulses from the output of the 4-stage MZI filter while the second timing marker (t2) is generated by the etalon pulses from the MRR thru port, selecting the appropriate 'Nth' pulse to use for bandwidth control. The pulse from the 4-stage MZI filter used as the timer starting point can also be used for center wavelength control.

Figure 20:
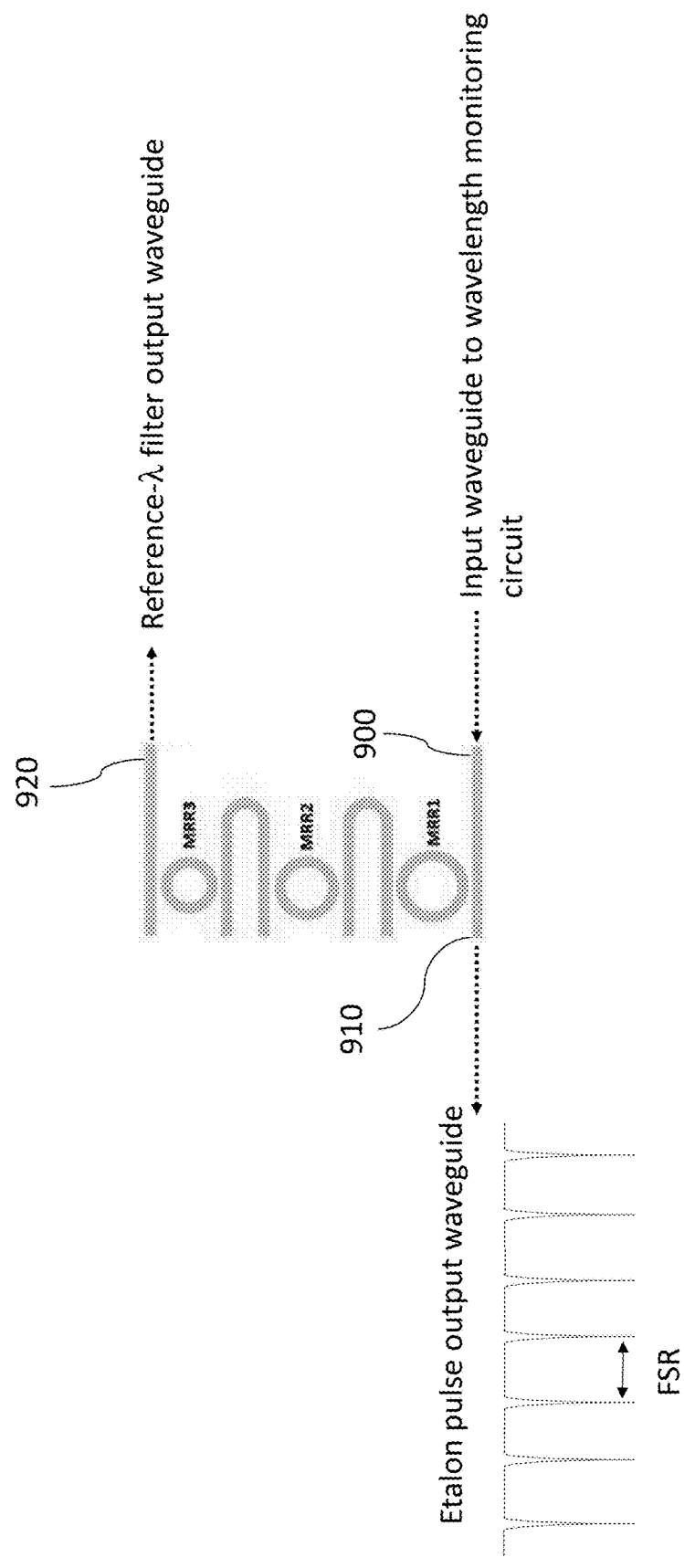
FIG. 20 shows the design of a PLC wavelength monitoring circuit according to another embodiment of the present invention that utilizes a single micro-ring resonator to generate the optical etalon pulses and a 3-stage coupled micro-ring resonator to generate the reference-wavelength filter.
Figure 21B:
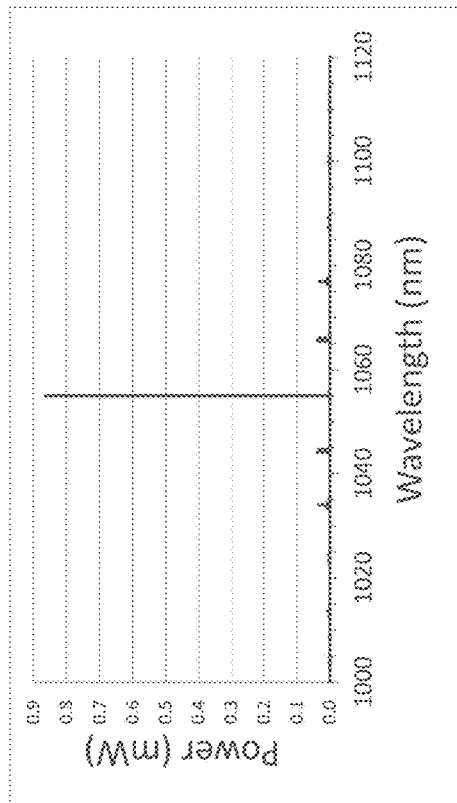
FIG. 21B shows the signal in the MRR3 drop port.
Figure 21A:
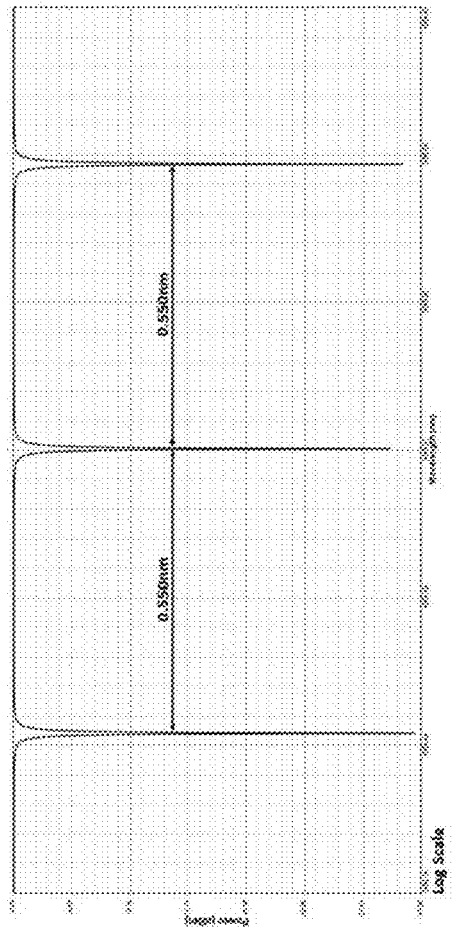
FIG. 21A shows the designed optical signal from the MRR1 thru port.

Another embodiment to implement the center wavelength and optical bandwidth control method described previously is the 3-stage MRR integrated optical circuit shown in FIG. 20. The optical signal from the tunable laser enters the circuit on the input waveguide 900 and is incident on the first MRR (MRR1). MRR1 serves as the optical etalon, providing optical pulses in the MRR1 'thru' port waveguide 910 in similar manner to the transmitted signal through a bulk optical etalon. The designed optical signal from the MRR thru port is shown in FIG. 21A and has an FSR of approximately 0.55 nm. The signal in the MRR1 drop port is coupled to the $2^{nd}$ MRR (MRR2) and in turn the signal in the MRR2 drop port is coupled to the $3^{rd}$ MRR (MRR3). MRR2 and MRR3 are designed in a vernier way so that only one pulse from MRR1 is transmitted. The signal in the MRR3 drop port waveguide 920 provides the Reference Wavelength Filter (λ-Filter), as shown in FIG. 21B, there is only one transmitted pulse over wavelength range 1000 nm-1120 nm. In this embodiment, the timer starting point (t1, lambda1) is generated by the signal in the MRR3 drop port waveguide while the second timing marker (t2) is generated by the etalon pulses from the MRR1 thru port, selecting the appropriate 'Nth' pulse to use for bandwidth control. The pulse from the MRR3 drop port used as the timer starting point can also be used for center wavelength control. This embodiment has the advantage compared to the previous embodiment with 4-stage MZI filter in that there is only one signal pulse out of the Reference λ-Filter over the entire tuning range, which makes establishing the control loop easier than if there are multiple signals.

Figure 22:
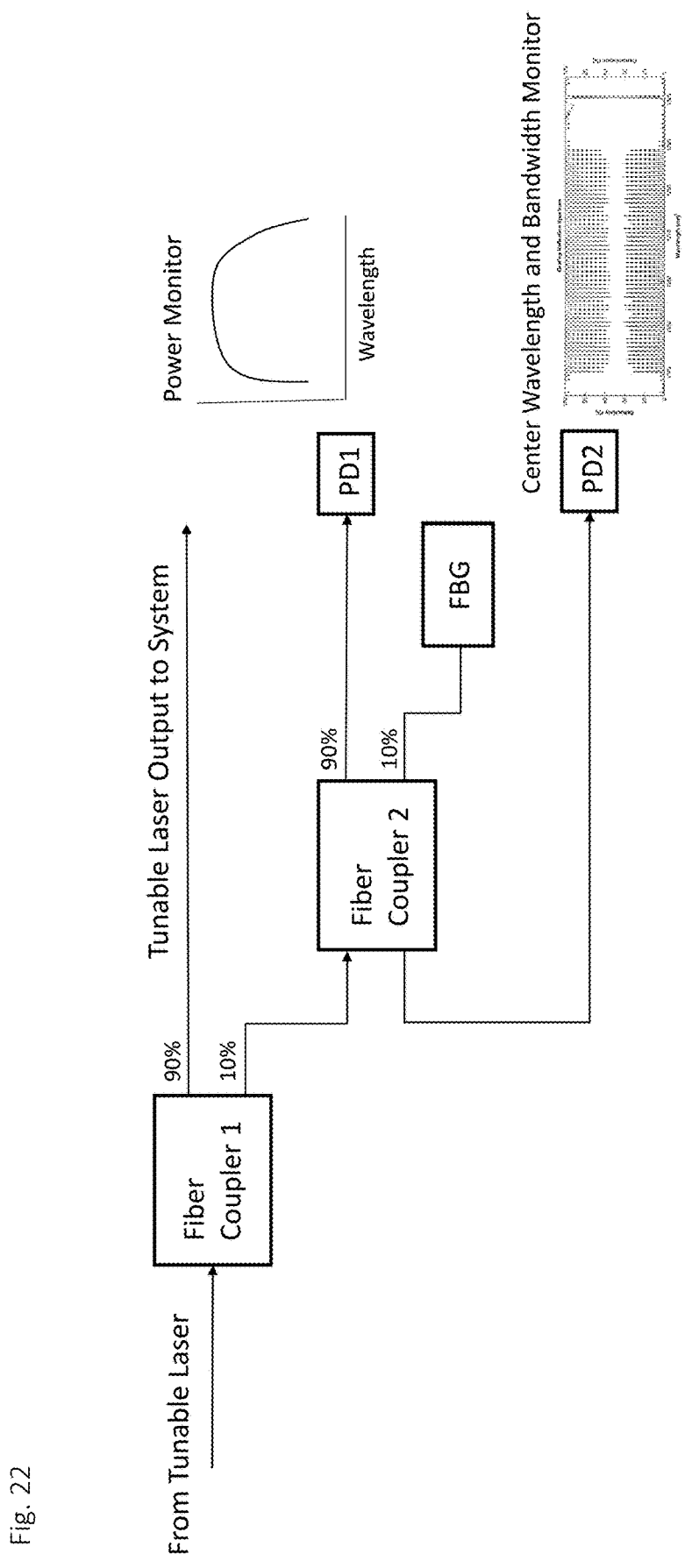
FIG. 22 shows an optical circuit using a multi-channel fiber Bragg grating to control the center wavelength and optical bandwidth of a tunable laser.
Figure 23:
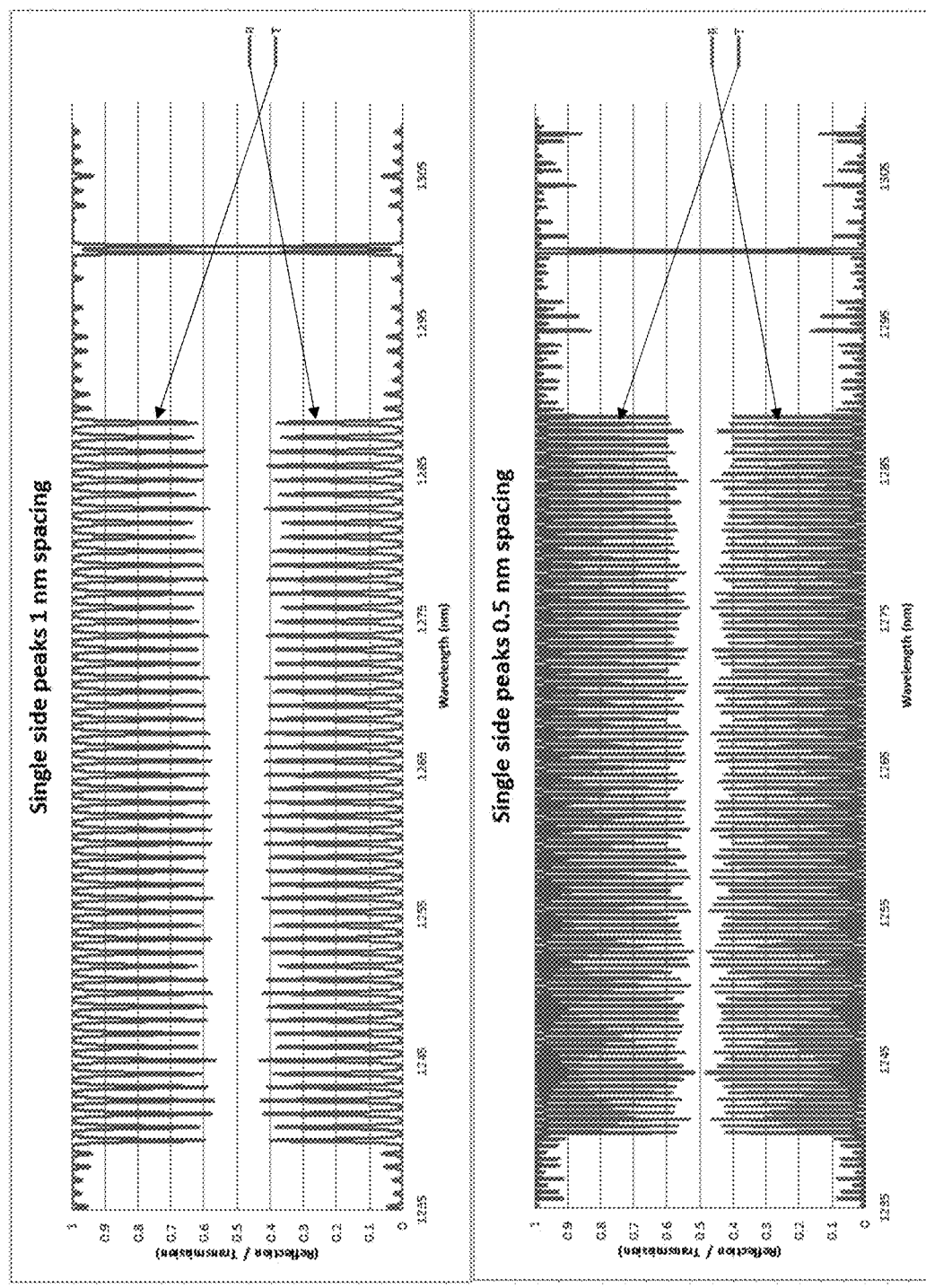
FIG. 23 shows the design of a single multi-channel fiber Bragg grating that generates both the optical etalon pulses and the reference-wavelength filter.

This same method can be applied for use in any type of tunable swept source laser and is not limited to the integrated optical assembly embodiments in this disclosure. For example, an FBG can be used as the Reference λ-Filter and a Mach-Zehnder Interferometer (MZI) or FBG having multiple reflection peaks may be used in a similar manner as the etalon to obtain the same timing information for the follow-on control algorithms. An embodiment using a specially-designed FBG with multiple reflection peaks is shown in FIG. 22. The output from the tunable laser is incident on an FBG that is designed to have one main reflection peak that is higher in amplitude than all the other reflection peaks, as shown in FIG. 23. There are no reflection peaks for wavelengths longer than the main reflection peak (which is at 1300 nm in this example), and there is a guard band of approximately 10 nm on the short wavelength side of the main reflection peak where there are also no reflection peaks. For wavelengths shorter than approximately 10 nm below the main peak there is a series of reflection peaks spaced equally in the frequency domain. Two different designs are shown in FIG. 23, one design has the side peaks having approximately 1 nm spacing and the other having approximately 0.5 nm spacing. The reflectance of the main peak is greater than 90%, whereas the reflectance of the side peaks is approximately 40%. This difference in reflection amplitude makes it easier to distinguish between the main peak and the side peaks and to set appropriate thresholds for detecting the main peak, which serves as the Reference λ-Filter, compared to detecting the side peaks which are the etalon signals. In this example, the timer starting point (t1, lambda1) is generated by the main reflectivity peak while the second timing marker (t2) is generated by the etalon pulses from the side peaks, selecting the appropriate 'Nth' pulse to use for bandwidth control.

Figure 24A:
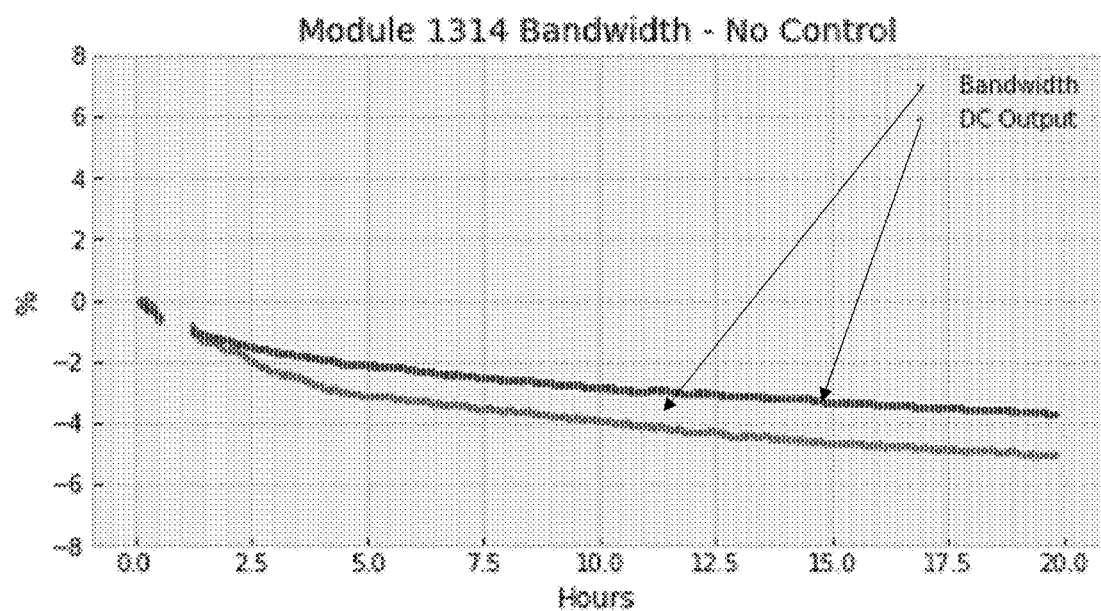
FIGS. 24A and 24B show the operation of a tunable MEMS-VCSEL without and with optical bandwidth control respectively.
Figure 24B:
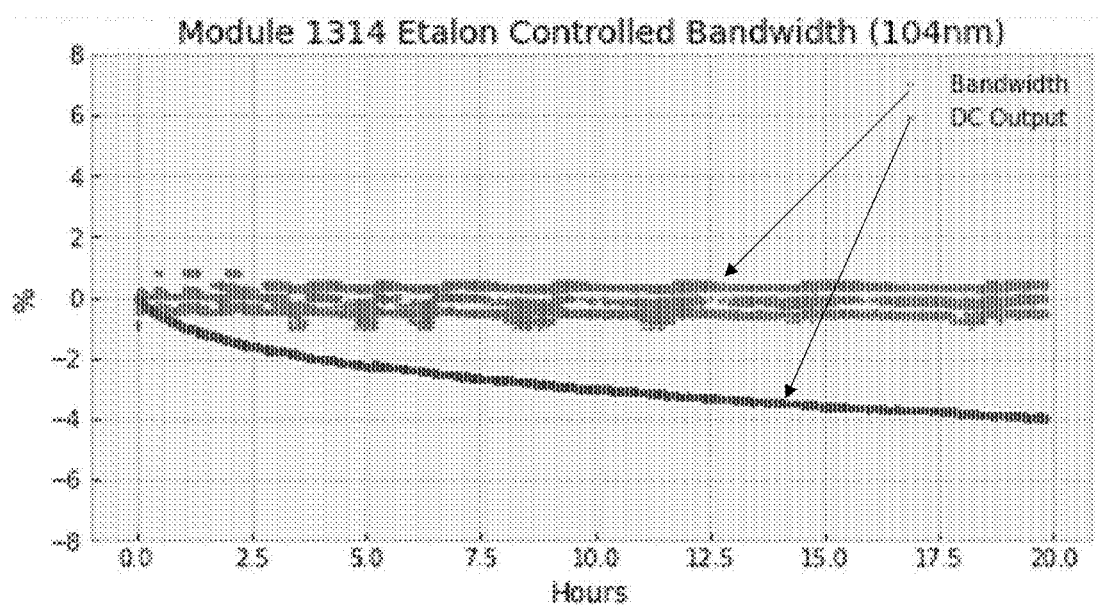

The application of the optical bandwidth control method described in the preceding sections is demonstrated in FIGS. 24A and 24B, which show operation of a MEMS_VCSEL without and with bandwidth control. Without bandwidth control, there is a change in bandwidth of approximately −5% over 20 hours as the DC bias operating point slowly drifts (FIG. 24A). This change in bandwidth is eliminated with bandwidth control method engaged (FIG. 24B).

Optical Coherence Tomography (OCT) is a non-invasive, interferometric optical imaging technique that can generate micron resolution 2D and 3D images of tissue and other scattering or reflective materials. With applications in medicine, biological research, industrial inspection, metrology, and quality assurance, OCT can be used for subsurface imaging, surface profiling, motion characterization, fluid flow characterization, index of refraction measurement, birefringence characterization, scattering characterization, distance measurement, and measurement of dynamic processes. The most common implementation of OCT is spectral/Fourier domain OCT (SD-OCT), which uses a broadband light source, interferometer, and spectrometer. An alternate implementation of OCT is swept source OCT (SS-OCT). SS-OCT uses a tunable laser (sometimes called a wavelength swept laser), interferometer, OCT detector, and high speed analog to digital (A/D) converter. The tunable laser sweeps an emission wavelength in time which is used as input to an OCT interferometer. An OCT interferogram is formed by interfering and detecting light from a sample arm with light from a reference arm in the OCT interferometer, which is detected by the OCT detector and digitized by the A/D converter. Processing the digitized interferogram generates a reflectivity vs. depth profile of the sample, called an A-scan. Multiple A-scans can be obtained to generate two dimensional OCT images or three dimensional OCT volumes.

Figure 25A:
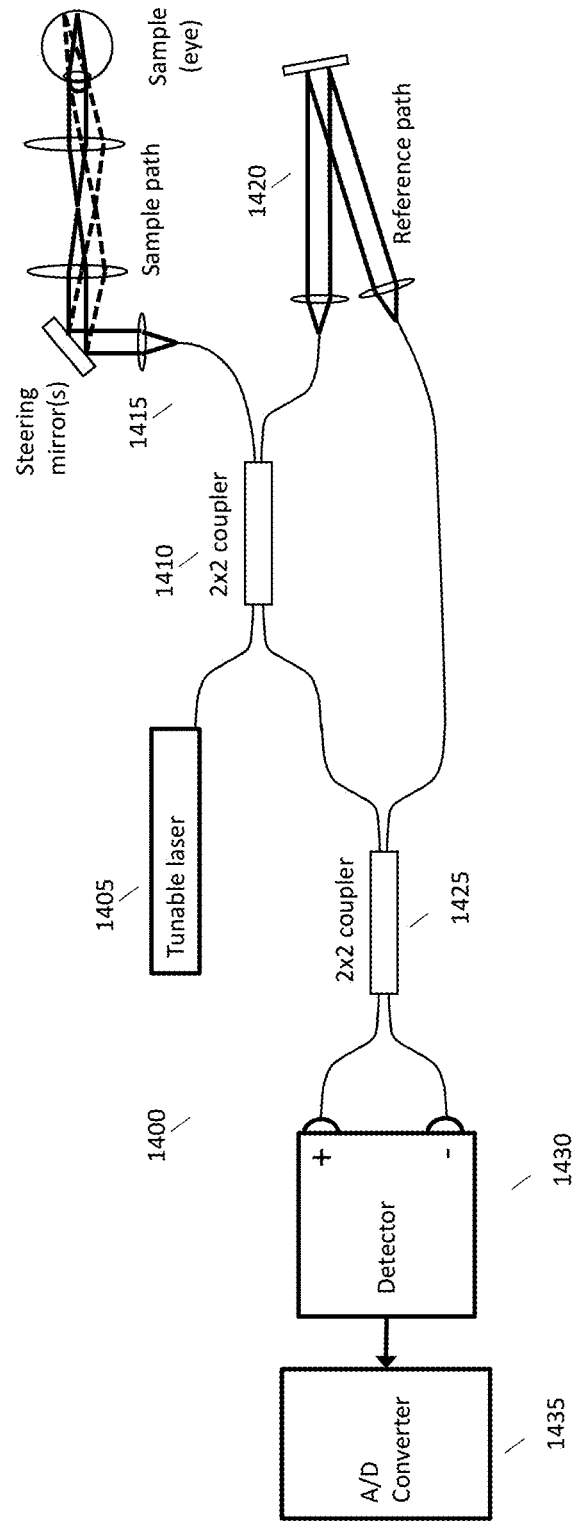
FIGS. 25A and 25B are schematic diagrams of example swept source OCT systems.
Figure 25B:
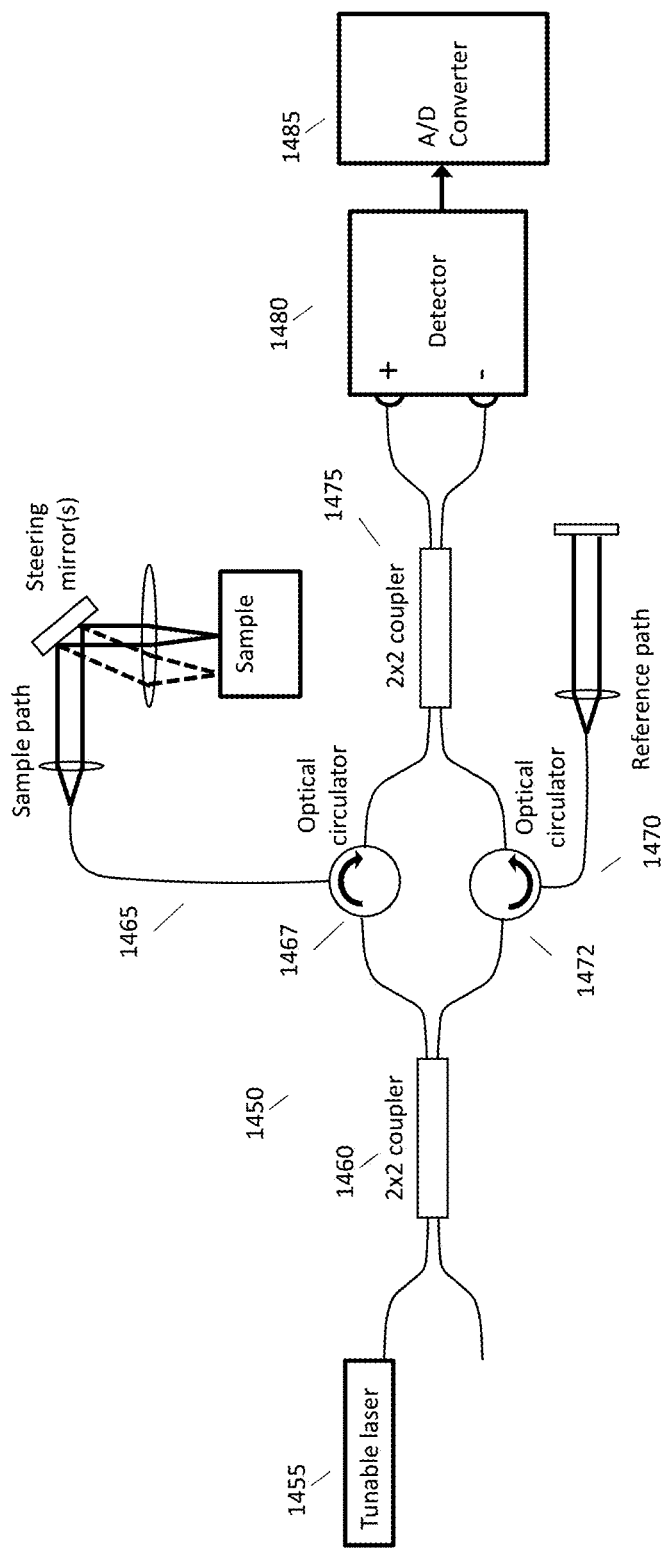

FIGS. 25A and 25B show schematic diagrams of example swept source OCT systems. Depending on the wavelength of operation, a coupler based or combined coupler and circulator based interferometer might be preferred. FIG. 25A shows a swept source OCT system 1400 in which light from a tunable laser 1405 is directed to a coupler 1410 which splits light between a sample path 1415 and a reference path 1420. Light from the sample path 1415 and light from the reference path 1420 are combined at a path interfering element 1425 and directed to an OCT detector 1430. The electrical signal from the OCT detector 1430 is digitized by the A/D converter 1435. FIG. 25B shows a swept source OCT system 1450 in which light from a tunable laser 1455 is directed to a coupler 1460 which splits light between a sample path 1465 including an optical circulator 1467 and a reference path 1470 including an optical circulator 1472. Light from the sample path 1465 and light from the reference path 1470 are combined at a path interfering element 1475 and directed to an OCT detector 1480. The electrical signal from the OCT detector 1480 is digitized by the A/D converter 1485. While FIGS. 25A and 25B show common OCT system topologies, other OCT system topologies are possible including using various combinations of couplers and optical circulators not shown in FIG. 25. Components in a SS-OCT system may be any one of or any combination of fiber optic components, free space components, photonic integrated circuits (PIC), and planar lightwave circuits (PLC).

While the present invention has been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the invention. Furthermore, the foregoing describes the invention in terms of embodiments foreseen by the inventor for which an enabling description was available, notwithstanding that insubstantial modifications of the invention, not presently foreseen, may nonetheless represent equivalents thereto.

REFERENCES

[1] U.S. Pat. No. 6,362,878 B1, Wang, "Multipoint Wavelength Calibration Technique".
[2] Keysight Technologies, Data Sheet, 5988-8518EN, December 2017.
[3] U.S. Pat. No. 6,486,984 B1, Baney, "Wavelength Monitor Using Hybrid Approach".
[4] U.S. Pat. No. 5,850,292, Braun, "Wavelength Monitor for Optical Signals".
[5] U.S. Pat. No. 6,043,883, Leckel, "Wavemeter and an Arrangement for the Adjustment of the Wavelength of the Signals of an Optical Source".
[6] H. Nasu, "Wavelength Monitor Integrated Laser Modules for 25-GHz Spacing Tunable Applications", *IEEE J. Sel. Topics Quantum Electron.*, Vol. 11, No. 1, 2005, pp. 157-164.
[7] U.S. Pat. No. 6,498,800 B1, Watterson, "Double Etalon Optical Wavelength Reference Device".
[8] U.S. Pat. No. 6,594,022 B1, Watterson, "Wavelength Reference Device".
[9] R. Yu, "Rapid High-Precision In Situ Wavelength Calibration for Tunable Lasers Using an Athermal AWG and a PD Array", *IEEE Photon. Technol. Lett.*, Vol. 24, No. 1, 2012, pp. 70-72.
[10] U.S. Pat. No. 5,982,791, Sorin, "Wavelength Tracking in Adjustable Optical Systems".
[11] G. Keiser, "Optical Fiber Communications", $1^{st}$ ed, McGraw-Hill, 1983, p. 23.
[12] R. Kim, "Highly Linear-Polarized External Cavity Lasers Hybrid Integrated on Planar Lightwave Circuit Platform", *IEEE Photon. Technol. Lett.*, Vol. 18, No. 4, 2006, pp. 580-582.
[13] Y. Fan, "Optically Integrated InP—Si3N4 Hybrid Laser", *IEEE Photonics Journal*, Vol. 8, No. 6, 2016, Article Sequence Number: 1505111
[14] T. Komljenovic "Heterogeneous Silicon Photonic Integrated Circuits", *J. Lightwave Technol.*, Vol. 34, No. 1, 2016, pp. 20-35
[15] D. Huang, "Sub-kHz Linewidth Extended-DBR Lasers Heterogeneously Integrated on Silicon", 2019 Optical Fiber Communications Conference and Exhibition (OFC), pp. 1-3
[16] O. Schwelb, "Transmission, group delay, and dispersion in single-ring optical resonators and add/drop filters—a tutorial overview", *J. Lightwave Technol.*, vol. 23, No. 11, 2004, pp. 1380-1394.
[17] W. Bogaerts, "Silicon microring resonators", Laser Photonics Rev. 6, No. 1, 2012, pp. 47-73.

What is claimed is:

1. A method for closed-loop controlling an absolute wavelength and an optical bandwidth of a swept-source tunable laser, wherein a closed-loop control uses timing information from a signal generated by a reference wavelength filter and an optical element that generates signal pulses corresponding to nearly equally spaced wavenumbers,
    wherein said reference wavelength filter and said optical element that generates signal pulses corresponding to nearly equally spaced wavenumber comprises a fiber Bragg grating (FBG) with multiple reflection peaks,
    wherein said FBG with multiple reflection peaks has one main reflection peak that is higher in amplitude than all the other reflection side peaks and serves as said wavelength reference filter, all other reflection side peaks generate said signal pulses corresponding to nearly equally spaced wavenumber.

2. The method of claim 1, wherein the said timing information from a signal generated by a reference wavelength filter is used for absolute wavelength control and said timing information from an optical element that generates signal pulses corresponding to nearly equally spaced wavenumbers is used for optical bandwidth control.

3. The method of claim 2, wherein the said timing information is comprised of a timer starting point generated by said reference wavelength filter and a second timing marker generated by said optical element that generates signal pulses corresponding to nearly equally spaced wavenumbers.

4. The method of claim 3, wherein said second timing marker is generated by selecting the appropriate 'Nth' pulse from said optical element that generates signal pulses corresponding to nearly equally spaced wavenumbers.

5. The method of claim 1, wherein said main reflection peak has a reflectance of greater than 90% and said reflection side peaks have a reflectance of less than approximately 40%.

6. The method of claim 1, wherein said main reflection peak is located within +/−20 nm of the center wavelength of the tunable laser.

7. The method of claim 1, wherein said reflection side peaks have a free spectral range (FSR) in the range of 0.1 nm to 10 nm.

8. The method of claim 1, wherein said optical element that generates signal pulses corresponding to nearly equally spaced wavenumber comprises an etalon.

9. The method of claim 1, wherein said reference wavelength filter comprises one of a fiber Bragg grating (FBG), notch filter, or bandpass filter.

10. The method of claim 1, wherein said reference wavelength filter and said optical element that generates signal pulses corresponding to nearly equally spaced wavenumber comprises a planar lightwave circuit (PLC) with integrated wavelength monitoring circuit (WMC).

11. The method of claim 10, wherein said WMC comprises at least one selected from a list of: a Bragg grating, a micro-ring resonator (MRR), and a Mach-Zehnder interferometer (MZI).

12. The method of claim 11, wherein said at least one MRR or at least one MZI generates said signal pulses corresponding to nearly equally spaced wavenumber used for optical bandwidth control.

13. The method of claim 12, wherein said at least one MRR or at least one MZI has a FSR in the range of 0.1 to 10 nm.

14. The method of claim 11, wherein said at least one selected from a list of: a Bragg grating, a MRR or a MZI generates signal pulses used for absolute wavelength control.

15. The method of claim 14, wherein said at least one selected from a list of: a Bragg grating, a MRR or a MZI generates said signal pulses in the range of 1 to 10 pulses as the tunable laser sweeps over its wavelength range.

16. The method of claim 10, wherein said WMC comprises at least one Bragg grating.

17. The method of claim 16, wherein said Bragg grating comprises said wavelength reference filter.

18. The method of claim 16, wherein said at least one Bragg grating has a main reflection peak located within +/−20 nm of the center wavelength of the tunable laser.

* * * * *